(12) United States Patent
Helander et al.

(10) Patent No.: US 10,439,081 B2
(45) Date of Patent: Oct. 8, 2019

(54) METHOD FOR DEPOSITING A CONDUCTIVE COATING ON A SURFACE

(71) Applicant: OTI Lumionics Inc., Toronto, Ontario (CA)

(72) Inventors: Michael Helander, Toronto (CA); Jacky Qiu, Toronto (CA); Zhibin Wang, Toronto (CA); Zheng-Hong Lu, Toronto (CA)

(73) Assignee: OTI Lumionics Inc., Toronto (CA)

( * ) Notice: Subject to any disclaimer, the term of this patent is extended or adjusted under 35 U.S.C. 154(b) by 0 days.

(21) Appl. No.: 14/440,797

(22) PCT Filed: Nov. 6, 2013

(86) PCT No.: PCT/CA2013/050848
§ 371 (c)(1),
(2) Date: May 5, 2015

(87) PCT Pub. No.: WO2014/071518
PCT Pub. Date: May 15, 2014

(65) Prior Publication Data
US 2015/0287846 A1    Oct. 8, 2015

Related U.S. Application Data

(60) Provisional application No. 61/723,127, filed on Nov. 6, 2012.

(51) Int. Cl.
*H01L 31/02* (2006.01)
*H01L 31/0236* (2006.01)
(Continued)

(52) U.S. Cl.
CPC .......... *H01L 31/02366* (2013.01); *C09D 5/24* (2013.01); *C23C 14/024* (2013.01);
(Continued)

(58) Field of Classification Search
CPC .................. H01L 2031/0344; H01L 31/02366
See application file for complete search history.

(56) References Cited

U.S. PATENT DOCUMENTS 4,885,211 A    12/1989 Tang et al.
5,059,862 A    10/1991 VanSlyke et al.
(Continued)

FOREIGN PATENT DOCUMENTS

CA    2450611 A1    2/2004
CA    2552488 A1    9/2005
(Continued)

OTHER PUBLICATIONS

"Chinese Application No. 201380058142.7, Search Report dated Aug. 15, 2016", w/ English Translation. (Aug. 15, 2016), 4 pgs.
(Continued)

*Primary Examiner* — Caridad Everhart
*Assistant Examiner* — Ankush Singal
(74) *Attorney, Agent, or Firm* — Schwegman Lundberg & Woessner, P.A.

(57) ABSTRACT

A method for depositing a conductive coating on a surface is provided, the method including treating the surface by depositing fullerene on the surface to produce a treated surface and depositing the conductive coating on the treated surface. The conductive coating generally includes magnesium. A product and an organic optoelectronic device produced according to the method are also provided.

24 Claims, 27 Drawing Sheets

(51) Int. Cl.
| | |
|---|---|
| *C23C 14/20* | (2006.01) |
| *C23C 14/02* | (2006.01) |
| *C23C 14/24* | (2006.01) |
| *H01L 51/00* | (2006.01) |
| *H01L 51/44* | (2006.01) |
| *H01L 51/52* | (2006.01) |
| *C09D 5/24* | (2006.01) |
| *H01L 31/18* | (2006.01) |
| *H01L 51/56* | (2006.01) |
| H01L 31/0256 | (2006.01) |

(52) U.S. Cl.
CPC .............. *C23C 14/20* (2013.01); *C23C 14/24* (2013.01); *H01L 31/18* (2013.01); *H01L 51/0021* (2013.01); *H01L 51/441* (2013.01); *H01L 51/5206* (2013.01); *H01L 51/5221* (2013.01); *H01L 51/56* (2013.01); H01L 51/0046 (2013.01); H01L 2031/0344 (2013.01); Y02E 10/549 (2013.01); Y10T 428/30 (2015.01)

(56) References Cited

U.S. PATENT DOCUMENTS

| | | |
|---|---|---|
| 6,794,061 B2 | 9/2004 | Liao et al. |
| 7,009,338 B2 | 3/2006 | D'Andrade et al. |
| 7,285,907 B2 | 10/2007 | D'Andrade et al. |
| 8,040,053 B2 | 10/2011 | D'Andrade et al. |
| 8,105,701 B2 | 1/2012 | Matsuura et al. |
| 8,445,895 B2 * | 5/2013 | Okumoto ............... B82Y 10/00 257/40 |
| 8,658,442 B2 | 2/2014 | Schmid et al. |
| 8,659,010 B2 * | 2/2014 | Song .................. H01L 51/0046 257/40 |
| 8,729,528 B2 | 5/2014 | Klem |
| 8,994,010 B2 | 3/2015 | Choi et al. |
| 9,088,004 B2 | 7/2015 | Chung |
| 9,287,338 B2 | 3/2016 | So et al. |
| 9,315,387 B2 * | 4/2016 | Shin ....................... B82Y 30/00 |
| 2004/0048033 A1 | 3/2004 | Klausmann et al. |
| 2004/0214041 A1 | 10/2004 | Lu et al. |
| 2005/0062406 A1 | 3/2005 | Kinoshita |
| 2005/0288236 A1 * | 12/2005 | Lebovitz .................. A61K 8/19 514/23 |
| 2006/0006796 A1 * | 1/2006 | Lee ........................ B82Y 10/00 313/504 |
| 2006/0011927 A1 * | 1/2006 | Ko .......................... B82Y 10/00 257/79 |
| 2006/0202614 A1 * | 9/2006 | Li ........................... B82Y 10/00 313/506 |
| 2006/0228543 A1 | 10/2006 | Lu et al. |
| 2006/0251924 A1 * | 11/2006 | Lu ........................... B82Y 10/00 428/690 |
| 2008/0258612 A1 * | 10/2008 | Kim .................... H01L 51/5215 313/504 |
| 2009/0011278 A1 | 1/2009 | Choi et al. |
| 2009/0050206 A1 * | 2/2009 | Halls ...................... B82Y 10/00 136/263 |
| 2009/0066223 A1 * | 3/2009 | Yabe ....................... C09K 11/06 313/504 |
| 2009/0151787 A1 * | 6/2009 | Yoshikawa ............ B82Y 10/00 136/261 |
| 2009/0166512 A1 * | 7/2009 | Furst ...................... B82Y 10/00 250/208.1 |
| 2009/0199903 A1 | 8/2009 | Oyamada et al. |
| 2012/0016074 A1 | 1/2012 | Elizalde et al. |
| 2012/0211078 A1 | 8/2012 | Kato et al. |
| 2012/0216867 A1 * | 8/2012 | Ito ........................ C07D 209/56 136/263 |
| 2012/0280217 A1 * | 11/2012 | Matsuura ............ H01L 51/0096 257/40 |
| 2012/0313099 A1 | 12/2012 | Chung et al. |
| 2013/0000952 A1 * | 1/2013 | Srinivas .................... H01B 1/02 174/126.1 |
| 2013/0074920 A1 * | 3/2013 | Echegoyen ......... H01L 51/0035 136/256 |
| 2014/0110691 A1 | 4/2014 | Lin et al. |
| 2014/0186983 A1 | 7/2014 | Kim et al. |
| 2015/0060778 A1 | 3/2015 | Kim et al. |
| 2015/0076469 A1 | 3/2015 | Ikemizu et al. |
| 2019/0044089 A1 | 2/2019 | Helander et al. |

FOREIGN PATENT DOCUMENTS

| | | |
|---|---|---|
| CN | 1170383 A | 1/1998 |
| CN | 1596048 A | 3/2005 |
| CN | 102315390 A | 1/2012 |
| EP | 2012375 A2 | 1/2009 |
| JP | 07224012 A | 8/1995 |
| JP | 2002249765 A | 9/2002 |
| JP | 2004327436 A | 11/2004 |
| JP | 2004335610 A | 11/2004 |
| JP | 2007005047 A | 1/2007 |
| JP | 2008541356 A | 11/2008 |
| JP | 2009016332 A | 1/2009 |
| JP | 2010219447 A | 9/2010 |
| JP | 2011181413 A | 9/2011 |
| JP | 2012160702 A | 8/2012 |
| TW | 201237197 A | 9/2012 |
| TW | 201237197 A | 9/2012 |
| WO | WO-2004097954 A1 | 11/2004 |
| WO | WO-2006121872 A2 | 11/2006 |
| WO | WO-2012/016074 A1 | 2/2012 |
| WO | WO-2014071518 A1 | 5/2014 |

OTHER PUBLICATIONS

"European Application Serial No. 13853612, Supplemental European Search Report dated May 27, 2016", 3 pgs.

"International Application Serial No. PCT/CA2013/050848, Written Opinion dated Mar. 3, 2014", 7 pgs.

Chen, Y., et al., "Fullerides of alkaline-earth metals", *Phys. Rev. B*, 45(15), (1992), 8845-8848.

Cheng, Gang, et al., "White organic light-emitting devices with a phosphorescent multiple emissive layer", *Applied Physics Letters* 89, 043504, (2004), 331-336.

D'Andrade, Brian W., et al., "Controlling Exciton Diffusion in Multilayer White Phosphorescent Organic Light Emitting Devices", *Advanced Materials*. 14(2), (2002), 147-151.

D'Andrade, Brian W., et al., "Efficient Organic Electrophosphorescent White-Light-Emitting Device with a Triple Doped Emissive Layer", *Advanced Materials*, 16(7), (2004), 624-628.

Reineke, Sebastian, et al., "White organic light-emitting diodes with fluorescent tube efficiency", *Nature*, vol. 459, (2009), 234-238.

Srivastava, Ritu, et al., "Fabrication of white organic light-emitting diodes by co-doping of emissive layer", *Indian Journal of Pure & Applied Physics*, vol. 47, (2009), 19-23.

Sun, Yiru, et al., "Management of singlet and triplet excitors for efficient white organic light-emitting devices", *Nature*, vol. 440, (2006), 908-912.

Tokito, Shizuo, et al., "High-efficiency blue and white phosphorescent organic light-emitting devices", *Current Applied Physics*, 5(4), (2005), 331-336.

Tsujioka, Tsuyoshi, et al., "Selective Metal Deposition on Photoswitchable Molecular Surfaces", *J. Am. Chem Soc.*, 130(32), (2008), 10740-10747.

Wang, et al., "Manipulating Charges and Excitons within a Single-Host System to Accomplish Efficiency/CRI/Color-Stability Trade-off for High-Performance OWLEDs", *Advanced Materials*, 21, (2009), 2397-2401.

Wang, Qi, et al., "Manipulating Charges and Excitons within Single-Host System to Accomplish Efficiency/CRI/Color-Stability Trade-off for High Performance OWLEDS", Supporting Information, (2008), 8 pgs.

"Japanese Application Serial No. 2015-540005, Office Action dated Jul. 3, 2018", w/ English Summary, (Jul. 3, 2018), 4 pgs.

(56) References Cited

OTHER PUBLICATIONS

Chikamatsu, Masayuki, et al., "C60 thin-film transistors with low work-function metal electrodes", Applied physics letters 85.12, (2004), 2396-2398.

Taima, Tetsuya, et al., "Insertion of thin interlayers under the negative electrode of C60 Schottky-type photovoltaic cells", The Journal of Physical Chemistry B 108.1, (2004), 1-3.

"U.S. Appl. No. 15/781,588, Notice of Allowance dated Mar. 7, 2019", 8 pgs.

"U.S. Appl. No. 15/781,588, Preliminary Amendment filed Jun. 5, 2018", 6 pgs.

"Chinese Application Serial No. 201380058142.7, Chinese Search Office dated May 8, 2017", w/English Translation, 24 pgs.

"European Application Serial No. 13853612, Extended European Search Report dated May 27, 2016", 3 pgs.

"International Application No. PCT/CA2016/051502, International Search Report dated Mar. 16, 2017", (Mar. 16, 2017), 3 pgs.

"International Application No. PCT/CA2016/051502, Written Opinion dated Mar. 16, 2017", (Mar. 16, 2017), 4 pgs.

"International Application Serial No. PCT/CA2013/050848, International Search Report dated Mar. 3, 2014", 4 pgs.

"International Application Serial No. PCT/CA2013/050848, Written Opinion dated Jul. 13, 2005", 7 pgs.

"International Application Serial No. PCT/CA2016/051502, International Search Report dated May 1, 2017", 3 pgs.

"Japanese Application Serial No. 2015-540005, Office Action dated Jul. 3, 2018", 4 pgs.

"Japanese Application Serial No. 2015-540005, Office Action dated Jul. 11, 2017", 11 pgs.

"Chinese Application No. 201380058142.7, Office Action dated May 8, 2017", w/ English Translation, (May 8, 2017), 22 pgs.

"Japanese Application No. 2015-540005, Office Action dated Jul. 11, 2017", w/ English Translation, (Jul. 11, 2017), 11 pgs.

U.S. Appl. No. 15/781,588, filed Jun. 5, 2018, Barrier Coating for Opto-Electronic Devices.

\* cited by examiner

METHOD FOR DEPOSITING A CONDUCTIVE COATING ON A SURFACE

CROSS REFERENCE TO PRIOR APPLICATIONS

This application is a U.S. National Stage under 35 U.S.C. 371 of International Application No. PCT/CA2013/050848, filed on 6 Nov. 2013, which published as WO 2014/071518 A1 on 15 May 2014, which application claims priority from U.S. Provisional Patent Application No. 61/723,127, filed 6 Nov. 2012, the contents of which applications are hereby incorporated by reference in their entireties.

TECHNICAL FIELD

The following relates to methods for producing electronic devices, and more specifically organic optoelectronic devices. In particular, the following relates to methods for depositing a conductive coating comprising magnesium on a surface.

BACKGROUND

Organic light emitting diodes (OLEDs) typically comprise several layers of organic materials interposed between conductive thin film electrodes, with at least one of the organic layers being an electroluminescent layer. When a voltage is applied to the electrodes, holes and electrons are injected from the anode and cathode, respectively. The holes and electrons injected by the electrodes migrate through the organic layers to reach the electroluminescent layer. When a hole and an electron are in close proximity, they are attracted to each other due to the Coulomb force. The hole and electron may then combine to form a bound state referred to as an exciton. As is well known, an exciton may decay though a radiative recombination process, in which a photon is released. Alternatively, an exciton may decay through a non-radiative recombination process, in which no photon is released.

A radiative recombination process can occur as a fluorescence or phosphorescence process, depending on the spin state of the electron-hole pair (i.e. the exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

Approximately one quarter of excitons formed in organic materials typically used in OLEDs are singlet excitons, with the remaining three quarters being triplet excitons. As is well known, a direct transition from a triplet state to a singlet state is considered to be a "forbidden" transition in quantum mechanics and, as such, the probability of radiative decay from a triplet state to a singlet state is generally very small. Unfortunately, the ground states of most organic materials used in OLEDs are singlet states, which prevent efficient radiative decay of an exciton in a triplet state to a singlet ground state at ambient temperatures in these materials. As such, in typical OLEDs, electroluminescence is primarily achieved by fluorescence, therefore giving rise to a maximum internal quantum efficiency of about 25%. It is noted that, as used herein, internal quantum efficiency (IQE) will be understood to be the proportion of all electron-hole pairs generated in the device which decay through a radiative recombination process.

Although radiative decay from a triplet state to the ground singlet state occurs at an extremely slow rate in most organic materials, the rate of decay (i.e. recombination rate) may be significantly increased by introducing species having high spin-orbit coupling constants. For example, complexes of transition elements such as Ir(III) and Pt(III) have been employed in so-called phosphorescent OLEDs, as the high spin-orbit coupling constants of these species promote a more efficient radiative decay from a triplet state to the ground singlet state. As such, some or all of the approximately 75% of excitons in the triplet states may also transition efficiently to the singlet ground state and emit light, thus resulting in a device having a maximum IQE of close to 100%.

The external quantum efficiency (EQE) of an OLED device may be defined as the ratio of charge carriers provided to the OLED to the number of photons emitted by the device. For example, an EQE of 100% implies that one photon is emitted for each electron that is injected into the device. As will be appreciated, the EQE of a device is generally substantially lower than the IQE of the device. The difference between the EQE and the IQE can generally be attributed to a number of factors such as absorption and reflection of light caused by various components of the device. One way of enhancing the EQE of a device is to use a cathode material that has a relatively low work function, such that electrons are readily injected into the adjacent organic layer during the operation of the device. Typically, aluminum is used as the cathode material due to its favourable electrical and optical properties. Specifically, it has a work function of 4.1 eV, is an excellent conductor, and has a relatively high reflectance in the visible spectrum when deposited as a film. Moreover, aluminum has advantageous processing characteristics compared to some other metals. For instance, aluminum has a deposition temperature of approximately 1600° C.

Although aluminum is typically chosen as a cathode material, in some applications, magnesium may, on its face, be a more favourable cathode material than aluminum. When compared to aluminum, magnesium has a lower work function of 3.6 eV. Magnesium can also be thermally deposited at deposition temperatures, for example, of 400° C. or less, which is substantially lower than the deposition temperature of aluminum, and is therefore more cost effective and easier to process.

However, as is noted in U.S. Pat. Nos. 4,885,211 and 5,059,862, substantially pure magnesium could not be used as an effective cathode for organic optoelectronic devices, since its adhesion to organic materials is poor and its environmental stability is low. US Publication No. 2012/0313099 further describes magnesium's poor adhesion to organic surfaces. Additionally, magnesium is prone to oxidation and, as such, devices with magnesium cathodes are difficult to manufacture and operate under oxygen and/or humid environments since the conductivity of the cathode quickly deteriorates as magnesium oxidizes.

Although it is possible to deposit magnesium on various inorganic surfaces such as those of glass and silicon, the sticking coefficient of magnesium on these surfaces is generally low. As such, the deposition rate of magnesium on such surfaces is also relatively low thus typical deposition processes known in the art are generally not cost-effective.

In U.S. Pat. No. 6,794,061 to Liao et al., an organic electroluminescent device is provided that includes an anode, a substantially pure magnesium cathode, an electroluminescent medium disposed between the anode and the cathode, and an adhesion-promoting layer in contact with the cathode and the electroluminescent medium, wherein the adhesion-promoting layer comprises at least one metal or metal compound. However, at least some metals or metal compounds suggested for use as adhesion-promoting layers by Liao et al. may be unstable and therefore not suitable for long-term use in many applications. For example, metals such as cesium are known to be strong reducing agents, and as such, they quickly oxidize when exposed to water, humidity, or air. Therefore, deposition of such metals is often complicated and difficult to integrate into conventional manufacturing processes for producing organic optoelectronic devices.

It has also previously been reported that magnesium will selectively adhere to the coloured states of some photochromic molecules [JACS 130, 10740 (2008)]. However, the applications of this discovery in the context of organic optoelectronic devices are few, as these materials are not typically used in organic optoelectronic devices.

As such, there exists a need for a method for promoting adhesion of magnesium to a surface that alleviates at least one of the deficiencies known in the art.

SUMMARY

In one aspect, a method for depositing a conductive coating on a surface is provided. The method comprises treating the surface by depositing fullerene on the surface to produce a treated surface, and depositing the conductive coating on the treated surface, the conductive coating comprising magnesium.

In another aspect, a product is provided, the product comprising a substrate having a surface coated with a conductive coating, the conductive coating comprising magnesium, and fullerene disposed at the interface between the conductive coating and the surface.

In yet another aspect, an organic optoelectronic device is provided, the organic optoelectronic device comprising an anode and a cathode, the cathode comprising magnesium, an organic semiconductor layer interposed between the anode and the cathode, and fullerene disposed between the organic semiconductor layer and the cathode.

BRIEF DESCRIPTION OF THE DRAWINGS

Embodiments will now be described by way of example only with reference to the appended drawings wherein.

DETAILED DESCRIPTION

Figure 1:
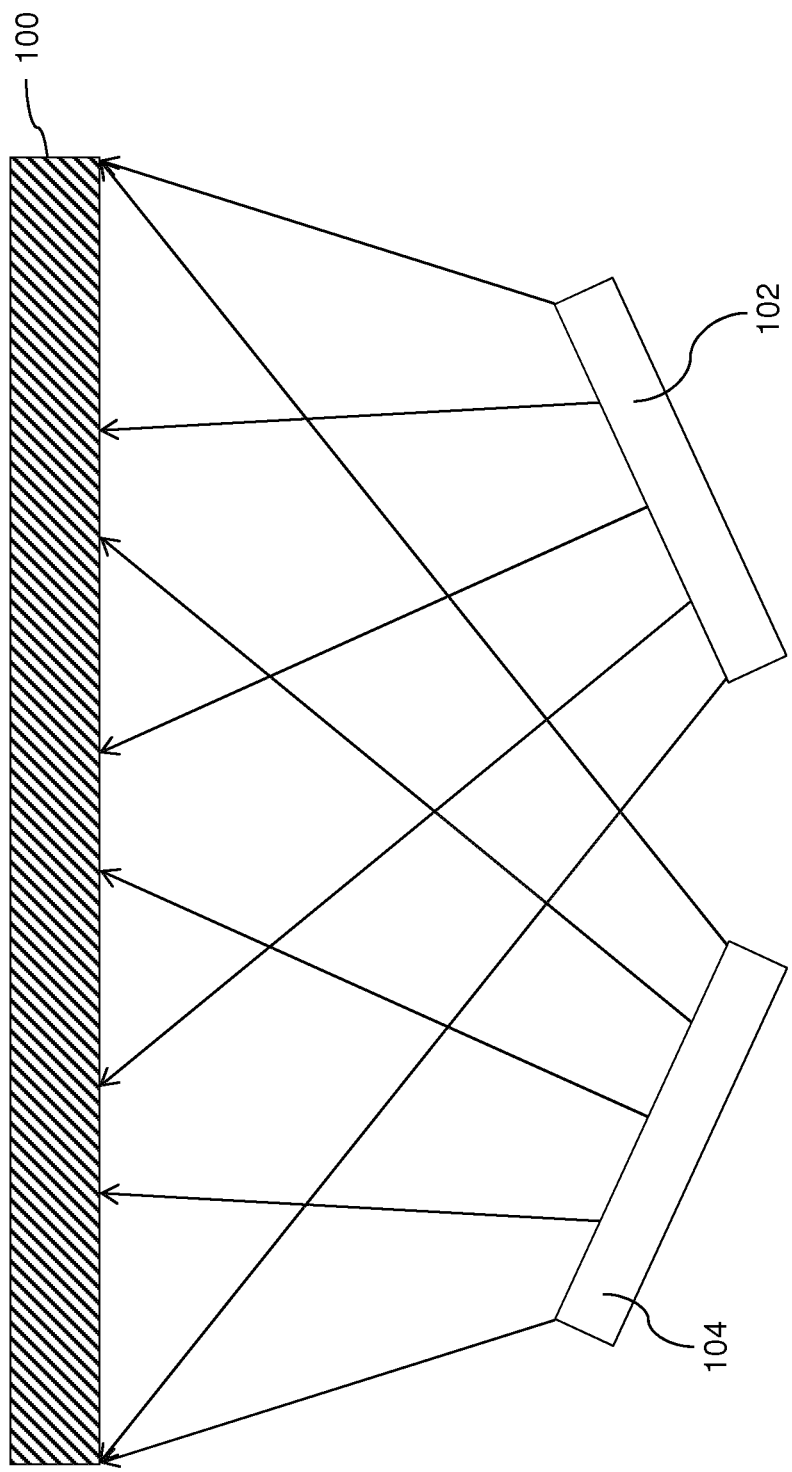
FIG. 1 is a diagram illustrating a method for depositing a conductive coating according to one embodiment, wherein separate magnesium and fullerene sources are used.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practised without these specific details. In other instances, well-known methods, procedures and components have not been described in detail so as not to obscure the example embodiments described herein.

In one aspect, there is provided a method for depositing a conductive coating on a surface, the method comprising treating the surface by depositing fullerene on the surface to produce a treated surface, and depositing the conductive coating on the treated surface, the conductive coating comprising magnesium.

Although the following is described with reference to deposition of a conductive coating comprising magnesium, it will be appreciated that the principles outlined herein may be applied to other metals and, in particular, alkali earth metals. For example, the deposited material may comprise beryllium, calcium, strontium, or barium, a mixture of various metals, or a mixture or compound comprising one or more metals and fullerenes. However, for clarity of illustration, examples are provided with reference to magnesium, which is the least reactive of the alkali earth metals and, as such, may be the preferred candidate for applications involving deposition on organic surfaces, for example, in the fabrication of OLED devices.

Based on previous findings and experimental observations, the inventors postulate that fullerenes, as will be explained further herein, act as nucleation sites for the deposition of the conductive layer comprising magnesium. For example, in cases where magnesium or magnesium alloy is deposited using an evaporation process on a fullerene treated surface, the fullerene molecules act as nucleation sites for initiating condensation (i.e. desublimation) of the magnesium or magnesium alloy. It has also been observed that less than a monolayer of fullerene may be provided on the treated surface to act as nucleation sites for successful deposition of magnesium in some cases. As will be understood, treating the surface by depositing several monolayers of fullerene may result in a higher number of nucleation sites.

However, it will be appreciated that the amount of fullerene deposited on the surface may be more, or less, than one monolayer. For example, the surface may be treated by depositing 0.1 monolayers, 1 monolayer, 10 monolayers, or more of fullerene. As used herein, depositing 1 monolayer of fullerene will be understood to mean that the amount of fullerene deposited on the surface is equivalent to the amount of fullerene required to cover the desired area of the surface with a single layer of fullerene molecules. Similarly, as used herein, depositing 0.1 monolayer of fullerene will be understood to mean that the amount of fullerene deposited on the surface is equivalent to the amount of fullerene required to cover 10% of the desired area of the surface with a single layer of fullerene molecules. It will be appreciated that, for example, due to stacking of fullerene molecules, depositing a single monolayer of fullerene on a surface may result in some areas of the surface being uncovered, while other areas of the surface may have 2 or more layers of fullerene deposited thereon.

Turning now to FIG. 1, a magnesium source 102 and a fullerene source 104 are used to deposit magnesium and fullerene, respectively, onto the surface of a substrate 100. It will be appreciated that various systems and apparatuses which may be used for depositing these materials are well known in the art.

In one embodiment, fullerene is deposited onto the surface of the substrate 100 by initiating the deposition by the fullerene source 104 prior to initiating deposition by the magnesium source 102. In such an embodiment, the surface of the substrate 100 is treated by deposition of fullerene, such that a fullerene adhesion promoting layer is produced on the surface of the substrate 100.

As mentioned above, the fullerene adhesion promoting layer may not completely cover the surface of the substrate 100, thereby leaving a substantial portion of the surface of the substrate 100 uncovered. Alternatively, the surface of the substrate 100 may be completely covered by fullerene. Once the surface of the substrate 100 has been treated, magnesium may be deposited by the magnesium source 102 to form a conductive coating. Fullerene deposited on the surface of the substrate 100 may act as nucleation sites, which allow the magnesium to bind to the fullerene molecules and subsequently grow through further deposition of magnesium to form a conductive coating. It is further postulated that the spaces or gaps between the fullerene molecules on the treated surface are gradually filled with magnesium as magnesium is deposited by the magnesium source 102.

In one embodiment, the fullerene source 104 may continue to deposit fullerene molecules on the surface of the substrate 100 while magnesium is being deposited by the magnesium source 102, thereby producing a conductive coating with fullerene molecules dispersed throughout or within the deposited magnesium. Alternatively, in another embodiment, the fullerene source 104 may cease to deposit fullerene molecules on the surface once the surface has been treated by depositing a fullerene adhesion promoting layer. In this way, the resulting conductive coating will comprise a substantially pure magnesium or magnesium alloy coating.

It will be appreciated that the magnesium source 102 may initiate the deposition of magnesium in advance of, or simultaneously with, the fullerene source 104. However, in such cases, it is likely that the majority of the magnesium incident on the surface of the substrate 100 prior to the surface becoming treated by deposition of fullerene would not adhere to the surface. As such, the conductive coating would only begin to form upon the surface being treated with a fullerene adhesion promoting layer. Furthermore, if a magnesium coating was to form, there would be few, if any, fullerene species at the interface of the magnesium coating and the surface upon which the magnesium is deposited.

In one embodiment, the fullerene and/or the magnesium are deposited using an evaporation process. As will be understood, an evaporation process is a type of physical vapor deposition (PVD) process, wherein one or more source materials are evaporated or sublimed under a vacuum environment and deposited on a target surface through condensation of the one or more evaporated source materials. A variety of different evaporation sources may be used for heating the source material, and as such, it will be appreciated that the source material may be heated in various ways. For example, the source material may be heated by an electric filament, electron beam, inductive heating, or by resistive heating.

By way of example, the deposition conditions for $C_{60}$ may be approximately 430 to 500° C. at a pressure of $10^{-7}$ Torr, thereby producing a deposition rate on the order of about 0.1 angstroms per second. The deposition conditions for magnesium may be approximately 380 to 430° C. in a Knudsen cell at a pressure of approximately $10^{-7}$ Torr, thereby producing a deposition rate on the order of about 2 or more angstroms per second. However, it will be appreciated that other deposition conditions may be used.

For example, magnesium may be deposited at temperatures up to 600° C. to achieve a faster rate of deposition, such as 10 to 30 nm per second or more. Referring to Table 1 below, various deposition rates measured using a K-cell magnesium deposition source to deposit substantially pure magnesium on a fullerene-treated organic surface of approximately 1 nm are provided. It will be appreciated that various other factors may also affect the deposition rate including, but not limited to, the distance between the source and the substrate, the characteristics of the substrate, the fullerene coverage on the substrate, the type of source used and the shaping of the flux of material from the source. The substrates 1 to 4 were subsequently used to fabricate OLED devices according to the methods described below.

TABLE 1

| Magnesium Deposition Rate by Temperature | | |
|---|---|---|
| Substrate | Temperature (° C.) | Rate (angstroms/s) |
| 1 | 510 | 10 |
| 2 | 525 | 40 |
| 3 | 575 | 140 |
| 4 | 600 | 160 |

It will be appreciated by those skilled in the art that the particular processing conditions used are variable and may depend on the equipment being used to conduct the deposition. It will also be appreciated that higher deposition rates are generally attained at higher temperatures, however, particular deposition conditions can be selected by those skilled in the art, for example by placing the substrate closer to the deposition source.

Figure 2:
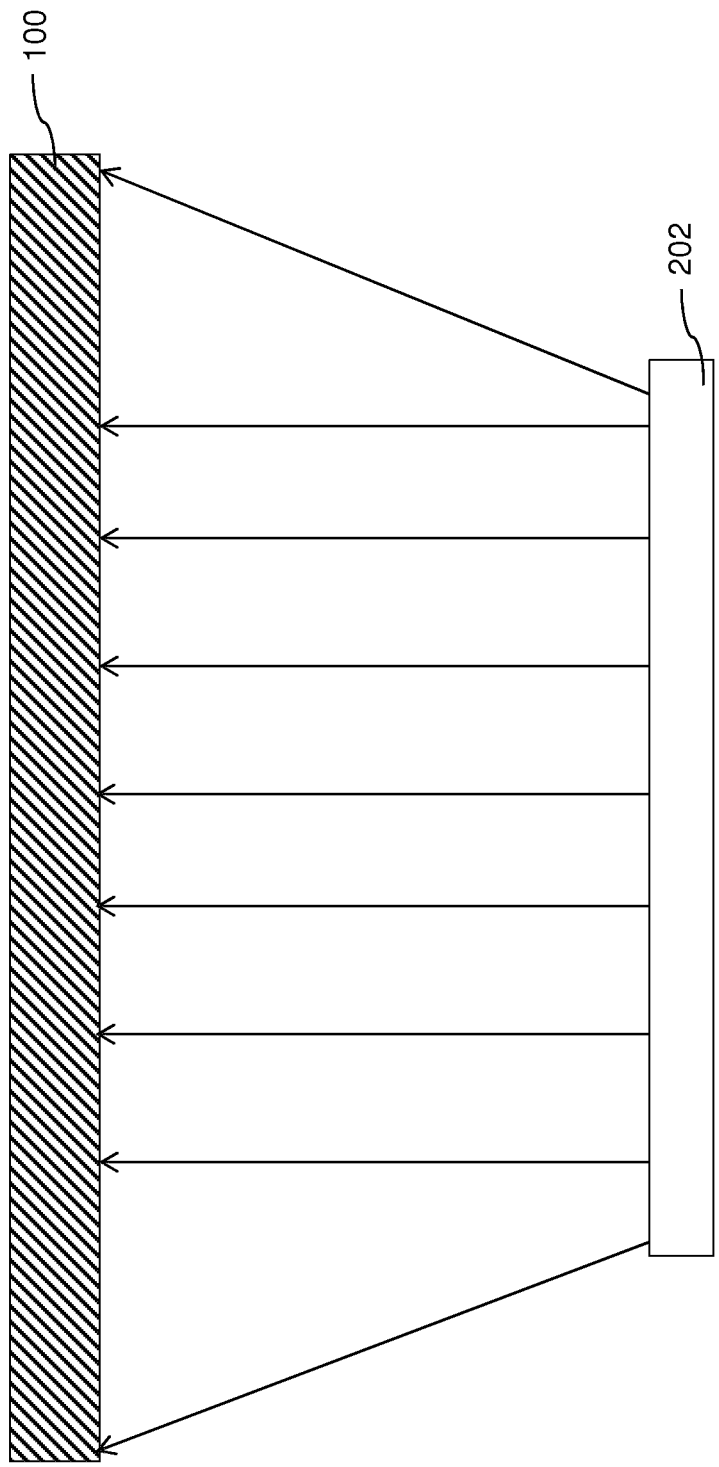
FIG. 2 is a diagram illustrating a method for depositing a conductive coating according to one embodiment, wherein a common deposition source comprising magnesium and fullerene are used.

In one embodiment, the magnesium and fullerene may both be deposited using the same deposition source. Referring to FIG. 2, the surface of the substrate 100 is illustrated as being subjected to a co-deposition process, wherein a common deposition source 202 deposits a material comprising magnesium and fullerene to both treat the surface and deposit the conductive coating. It is known that both magnesium and Buckminsterfullerene ($C_{60}$) have similar sublimation temperatures (~400° C.) under high vacuum conditions (e.g. pressures below ~$10^{-1}$ torr). As such, both magnesium and $C_{60}$ may be deposited using an evaporation deposition process from a single common source material formed by mixing the Mg and $C_{60}$ source materials.

It is noted that although the process described above and illustrated in FIG. 1 allows for fullerene to be deposited concurrently with magnesium, by providing a common deposition source for evaporating the common source material, the resulting conductive coating may be more uniform and the complexity of the deposition process may be reduced. The common deposition source 202 may also be shaped consistently with the substrate. For example, the magnesium and fullerene co-deposition source may be trough-shaped to enable a large area of a substrate to be covered with the conductive film. It will be appreciated that the relative amounts of fullerene and magnesium in the common source 202 may be varied. For example, the common source may comprise 1% by weight fullerene, 5% by weight fullerene, or 10% by weight fullerene with the remainder being a magnesium alloy or substantially pure magnesium.

In one example, the common source material for use with the common deposition source 202 comprises magnesium and fullerene. Furthermore, the common source material may be in a solid form, for example, as a bar, powder, or as a pellet. The common source material may also be in granular form. The solid common source material may be formed by compressing and/or heating a mixture of magnesium and fullerene. The resulting common source material may contain magnesium fulleride species. However, various other methods may be used to form a solid common deposition source to simplify distribution and lower the exposed surface area of the deposition source, which may be advantageous for processing under vacuum conditions.

It will also be appreciated that the common deposition source may comprise other materials which are not deposited during the deposition process. For example, the common deposition source may further comprise copper, which does not evaporate at the deposition temperatures of common fullerenes and magnesium.

By way of example, magnesium and $C_{60}$ may be co-deposited by heating the magnesium source material and the $C_{60}$ source material to approximately 380 to 430° C. in a Knudsen cell at a pressure of approximately $10^{-7}$ Torr. However, it will be appreciated by those skilled in the art that other deposition parameters may be used.

Although the method has been described with reference to evaporation for purposes of depositing fullerenes and magnesium, it will be appreciated that various other methods may be used to deposit these materials. For example, fullerene and/or magnesium may be deposited using other physical vapor deposition (PVD) processes, for example sputtering, chemical vapor deposition (CVD) processes, or other processes known for depositing fullerene or magnesium. In one embodiment, magnesium is deposited by heating a magnesium source material using a resistive heater. In other embodiments, magnesium source material may be loaded in a heated crucible, a heated boat, a Knudsen cell, or any other type of evaporation source. Similarly, fullerene source material or a mixture of fullerene and magnesium source material may be loaded in a heated crucible, a heated boat, a Knudsen cell, or any other type of evaporation source for deposition. Various other methods of deposition may be used.

The deposition source material used to deposit the conductive coating may be a mixture or a compound, whereby at least one of the components of the mixture or compound is not deposited on the substrate during the deposition. In one example, the source material may be a Cu—Mg mixture or Cu—Mg compound. In another example, the source material for a magnesium deposition source comprises magnesium and a material with a lower vapor pressure, for example Cu. In yet another example, the source material for a co-deposition source comprises a Cu—Mg compound mixed with fullerenes, for example, as a Cu—Mg fulleride compound. It will be appreciated that other low vapor pressure materials may be provided in the source material.

In one aspect, a product is provided, the product comprising a substrate having a surface coated with a conductive coating, fullerene disposed at the interface between the conductive coating and the surface, and wherein the conductive coating comprises magnesium.

Figure 3A:
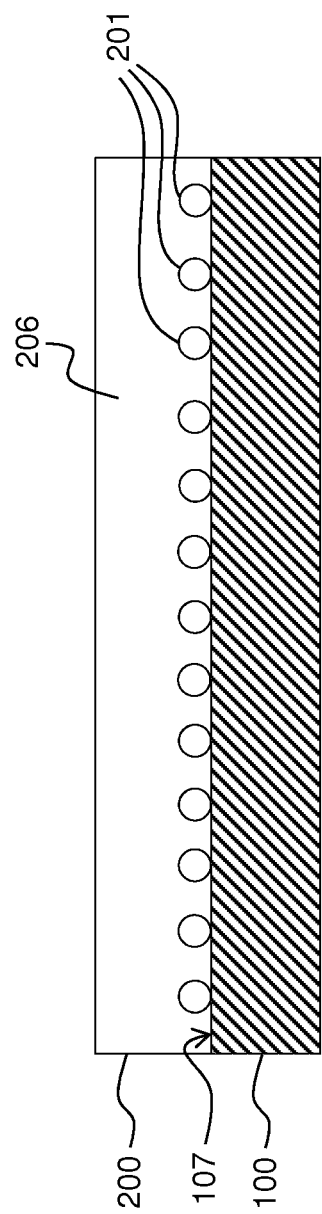
FIG. 3A is a diagram of a magnesium film deposited on a sub-monolayer fullerene adhesion promoting layer according to one embodiment.

FIG. 3A illustrates a product according to one embodiment wherein a surface 107 has been treated with fullerene and a conductive coating 200 comprising magnesium 206 has been deposited on the treated surface according to an embodiment of the method as described above. As illustrated in FIG. 3A, fullerene molecules 201 are disposed at the interface between the conductive coating 200 comprising magnesium 206 and the surface 107 of the substrate 100. In the embodiment of FIG. 3A, fullerene molecules 201 are illustrated as only partially covering the interface. As such, the conductive coating 200, or the deposited magnesium 206 in the conductive coating 200 in the illustrated embodiment, may be in contact with the surface 107 of the substrate 100.

Figure 3B:
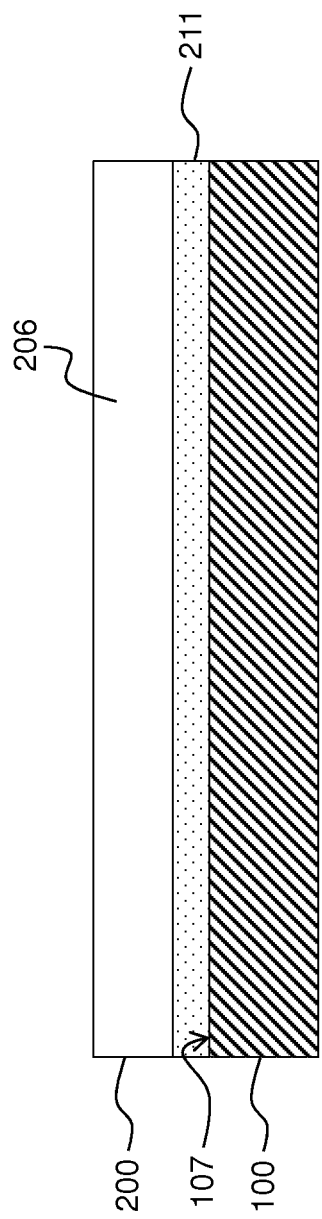
FIG. 3B is a diagram of a magnesium film deposited over a fullerene adhesion promoting layer according to one embodiment.

FIG. 3B illustrates a product according to another embodiment, wherein the surface 107 has been treated by depositing at least about a monolayer of fullerene to form a fullerene layer 211 which substantially covers the surface 107 of the substrate 100. As illustrated in FIG. 3B, the fullerene layer 211 disposed at the interface between the conductive coating 200 comprising magnesium 206 and the surface 107 of the substrate 100 substantially covers the interface.

Figure 3C:
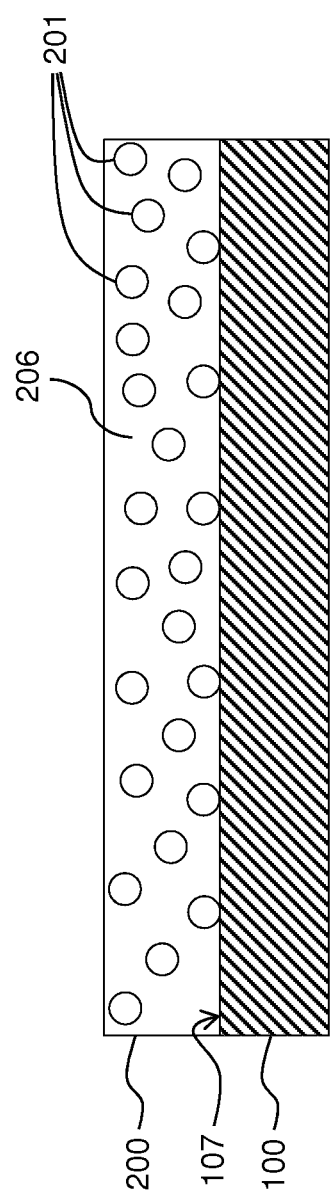
FIG. 3C is a diagram of a co-deposited conductive coating comprising magnesium intermixed with fullerene according to one embodiment.

FIG. 3C illustrates a product according to yet another embodiment, wherein the conductive coating 200 comprises fullerene molecules 201 dispersed throughout or within deposited magnesium 206. It will be appreciated that the product illustrated in FIG. 3C may be produced using one embodiment of the method described above in relation to FIG. 1 or the method described above in relation to FIG. 2. Although the fullerene molecules 201 may not be as prevalent at the interface between the conductive coating 200 and the surface 107 of the substrate 100 compared to the film shown in FIG. 3B, the conductive coating 200 may nevertheless be well adhered to the surface 107 of the substrate 100. In particular, it has been found dispersing fullerene molecules 201 throughout the magnesium 206 enhances the stability of the magnesium film in air by reducing the rate of oxidation of the magnesium. The inventors postulate that, based on experimental observations and previous findings, the fullerene molecules 201 dispersed throughout the magnesium 206 electronically and/or chemically interact with the magnesium 206 to enhance the stability of magnesium. More specifically, it is known that fullerenes are generally strong electron acceptors, and as such, may improve the oxidative stability of proximal magnesium atoms.

Furthermore, it will be appreciated that the concentration of fullerene in the conductive coating may be varied throughout the coating. For example, the concentration of fullerene near the treated surface may be relatively low (e.g. ~2 wt %), but the concentration of fullerene in the rest of the conductive coating may be relatively high (e.g. ~10 wt %). Alternatively, the concentration of fullerene near the treated surface may be relatively high (e.g. ~10 wt %) and the concentration of fullerene in the rest of the conductive coating may be relatively low (e.g. ~2 wt %). It will be appreciated that the relative concentrations of fullerene and magnesium may be varied by adjusting various deposition parameters.

In one embodiment, the product further comprises a getterer comprising magnesium. As will be understood by persons skilled in the art, a getterer is generally a material provided on a product or device for purposes of improving the "shelf-life" of the product or device. Getterers generally remove, passivate, contain, or otherwise inhibit unfavourable species from negatively affecting device performance. According to one embodiment, the getterer is formed integral with the conductive coating by depositing a relatively thick conductive coating comprising magnesium on the product. The getterer or the conductive coating may react with, or otherwise passivate, oxygen and/or water vapor present in the device packaging environment to produce magnesium oxide and/or hydroxide and thereby remove these molecules from the device packaging environment. The portion of the conductive coating acting as the getterer may have a reduced, or zero, concentration of fullerene to be more reactive. In another embodiment, the getterer may be deposited separately from the conductive coating. For example, the getterer comprising magnesium may be deposited over the conductive coating.

It will be appreciated that the substrate may comprise organic and/or inorganic materials. Accordingly, it will also be appreciated that the surface of such substrate may be any organic and/or inorganic surface upon which fullerene can be deposited. For further clarity, it will be understood that fullerene may be deposited on the surface using any method or process known in the art, and the fullerene deposited on the surface may be weakly or strongly bound to the surface by intermolecular forces, intramolecular forces, and any other type of forces, interaction and/or bonds. For example, fullerene may be bound to the surface by Van der Waals forces, electrostatic forces, gravitational forces, magnetic forces, dipole-dipole interactions, non-covalent interactions, and/or covalent bonds.

It will be appreciated organic substrate or organic surface, as used herein, will be understood to mean a substrate or surface primarily comprising an organic material. For greater clarity, an organic material will generally be understood to be any material containing carbon, wherein at least one carbon atom is covalently bonded to an atom of another type (e.g. hydrogen, oxygen, nitrogen, etc). Specifically, it has been observed that a conductive coating comprising magnesium may be deposited using a method according to the present invention on surfaces of organic semiconductor materials commonly used as the electroluminescent layer or the electron injection layer of organic light emitting diodes. Examples of such materials include 8-Hydroxyquinolinatolithium (Liq) and tris(8-hydroxy-quinolinato)aluminium (Alq$_3$). Other example surfaces on which the methods according to the present invention may be used include other organic semiconductor materials such as 4,4'-bis(N-carbazolyl)-1,1'-biphenyl (CBP), 1,3,5-tris-(N-phenylbenzimidazole-2-yl)-benzene (TPBi), bis(2-methyldibenzo[f,h]quinoxaline)(acetylacetonate)iridium(III), bis(2-phenylpyridine)(acetylacetonate)iridium(III), 1,3,5-tri[(3-pyridyl)-phen-3-yl]benzene, 4,7-diphenyl-1,10-phenanthroline (Bphen), 3-(4-biphenyl)-4-phenyl-5-tert-butylphenyl-1,2,4-triazole (TAZ), Mes$_2$B [p-4,4'-biphenyl- NPh(1-naphthyl)] (BNPB), and N,N'-di(naphthalen-1-yl)-N, N'-diphenyl-benzidine (NPB), or various other conjugated organic materials.

Furthermore, it will be appreciated that the methods according to the present invention may be used on surfaces of other various materials commonly used as an electron injection layer, electron transport layer, and/or electroluminescent layer of an organic optoelectronic device. For example, a thin layer of an inorganic material, such as LiF, may be interposed between an organic layer and the fullerene layer, as will be further described herein. The fullerene layer may impart one or more effects to the magnesium layer which may be beneficial, including higher sticking coefficient and better stability. Examples of such materials include organic molecules as well as organic polymers such as those described in PCT Publication No. 2012/016074. It will also be understood by persons skilled in the art that organic materials doped with various elements and/or inorganic compounds may still be considered to be an organic material. It will further be appreciated by those skilled in the art of organic electronic device fabrication that various organic materials may be used and the entire range of such organic materials are too numerous to name in the present application. However, it will also be apparent to those skilled in the art that the methods described herein are applicable with such materials.

It will also be appreciated that inorganic substrate or surface, as used herein, will be understood to mean a substrate or substrate primarily comprising an inorganic material. For greater clarity, an inorganic material will generally be understood to be any material that is not considered to be an organic material. Examples of inorganic materials include metals, glass, and minerals. Specifically, it has been observed that a conductive coating comprising magnesium may be deposited using a method according to the present invention on surfaces of LiF, glass and silicon (Si). Other surfaces on which the methods according to the present invention may be applied include those of silicon or silicone-based polymers, inorganic semiconductor materials, electron injection materials, salts, metals, and metal oxides.

It will be appreciated that the substrate may comprise a semiconductor material, and accordingly, the surface of such substrate may be a semiconductor surface. A semiconductor may be described as a material which exhibit electrical conductivity to a degree less than that of a conductor (e.g. metal) but greater than that of an insulator (e.g. glass). It will be understood that a semiconductor material may be an organic semiconductor or an inorganic semiconductor. Some examples of organic semiconductor materials are listed above. Some examples of inorganic semiconductor materials include, but are not limited to, Group IV elemental semiconductors, Group IV compound semiconductors, Group VI elemental semiconductors, III-V semiconductors, II-VI semiconductors, I-VII semiconductors, IV-VI semiconductors, IV-VI semiconductors, V-VI semiconductors, II-V semiconductors, oxides and other semiconductor materials.

Furthermore, it will be appreciated that the substrate may comprise multiple layers of organic and/or inorganic materials. For example, the substrate may comprise an electron injection layer, an electron transport layer, an electroluminescent layer, a hole transport layer, a hole injection layer and/or an anode in a case of an organic light-emitting diode (OLED).

For some applications, it may be desirable to selectively deposit magnesium onto portion(s) of an organic surface. For example, it may be desirable to selectively deposit magnesium onto portions of an organic surface such that it forms a regular or irregular pattern on the surface. In one embodiment, portion(s) of the organic surface where magnesium deposition is desired are treated by depositing fullerene. As magnesium exhibits very low adhesion to organic molecules generally used in organic optoelectronic devices, magnesium will selectively deposit on areas of the surface which have been treated with fullerene. As such, once the desired portion(s) of the surface has been treated, the entire surface may be exposed to a magnesium source to cause magnesium to be selectively deposited on the fullerene treated areas of the organic surface. The organic surface may be selectively treated with fullerene by using, for example, shadow mask deposition, contact printing, micro-contact printing, lithography, or other patterning techniques known in the art.

Figure 4:
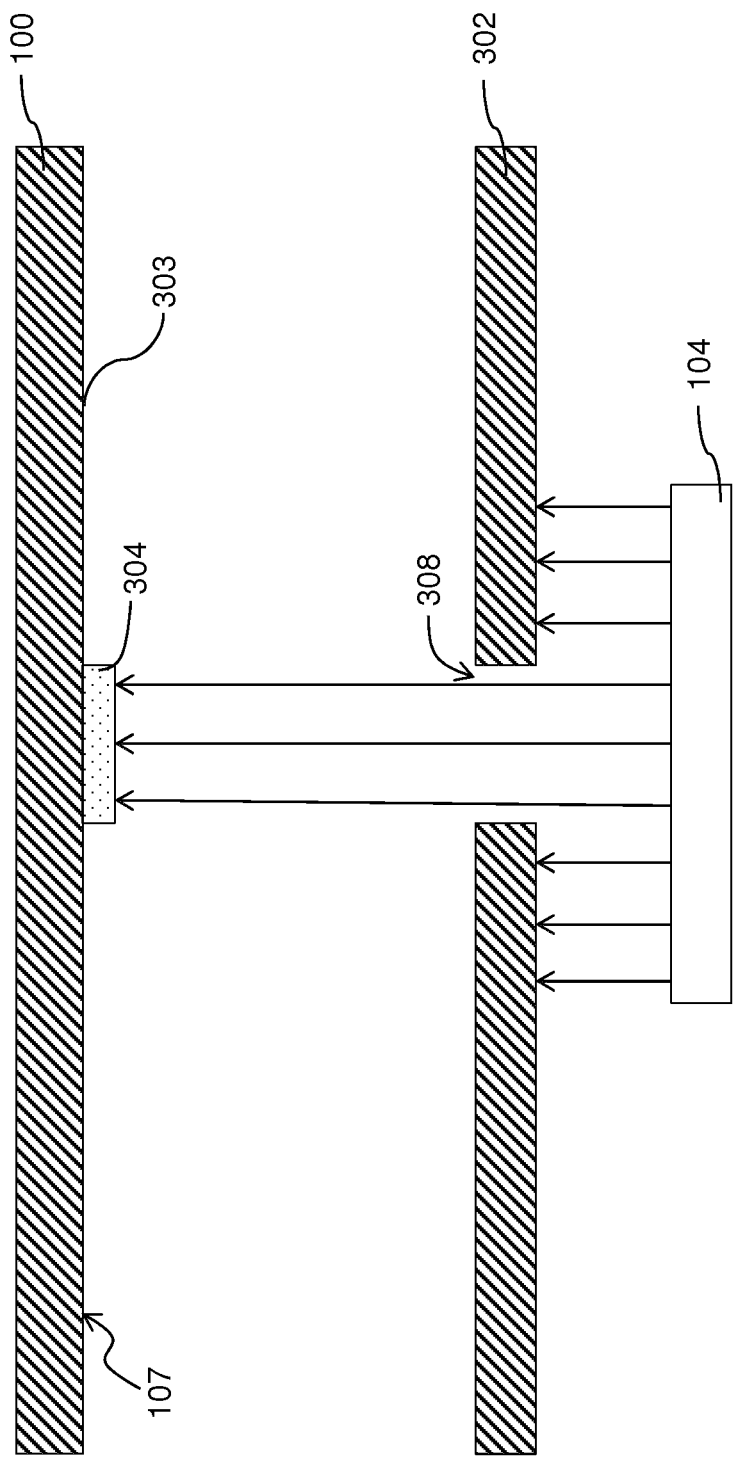
FIG. 4 is a diagram illustrating a shadow mask deposition process for selectively depositing fullerene on a substrate surface in one embodiment.

FIG. 4 shows a shadow mask process for depositing fullerene onto the surface 107 of a substrate 100 according to one embodiment. A shadow mask 302 is illustrated as having an aperture or gap 308 formed therein, which is shaped to correspond to the desired pattern or shape to be transferred onto the surface. More specifically, when using the shadow mask process in conjunction with an evaporation process as shown in FIG. 4, it will be appreciated that the aperture or gap 308 is formed in the shadow mask 302 to allow passage of some of the evaporated source material beyond the shadow mask 302 to be deposited on the surface 107 of the substrate 100 while inhibiting passage of the evaporated source material incident on the surface of the mask 302. Consequently, the pattern or shape of the deposited material corresponds to the pattern or shape of the aperture or gap 308 formed on the shadow mask 302.

As illustrated in FIG. 4, a fullerene source 104 is provided on the side of the shadow mask 302 opposite to the substrate 100. Upon the fullerene source 104 directing fullerene at the substrate 100, the shadow mask 302 inhibits the deposition of fullerene from reaching areas of the surface 107 covered by the shadow mask 302 to create an untreated area 303 on the surface 107 of the substrate 100, while enabling deposition of fullerene on areas of the surface 107 corresponding to the aperture or gap 308 of the shadow mask 302 to create a treated area 304 on the surface 107 of the substrate 100. Although the shadow mask 302 is illustrated as having only one aperture or gap 308 in the illustrated embodiment, it will be appreciated that the shadow mask 302 may comprise additional apertures or gaps.

Figure 5B:
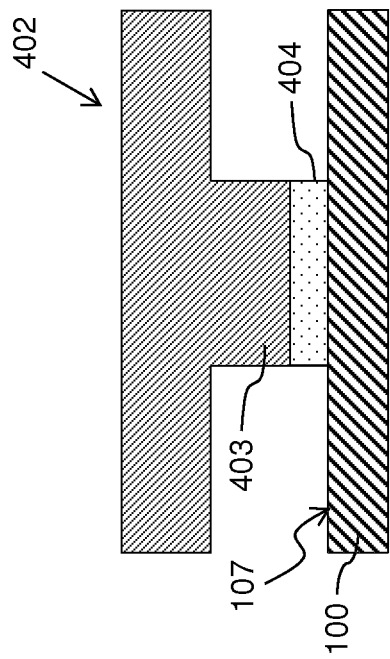
FIGS. 5A to 5C illustrate a micro-contact printing process for selectively depositing fullerene on a substrate surface according to one embodiment.
Figure 5A:
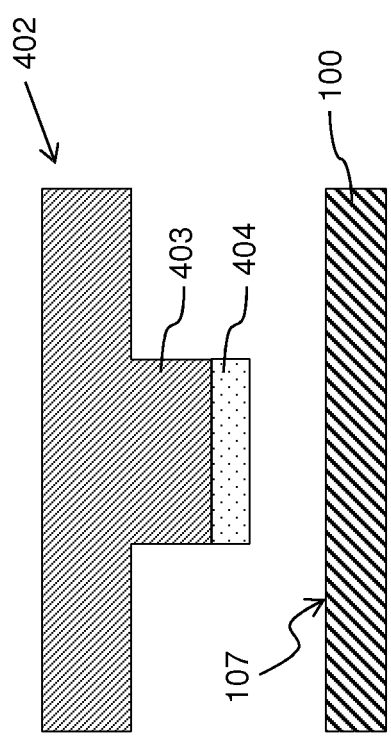
Figure 5C:
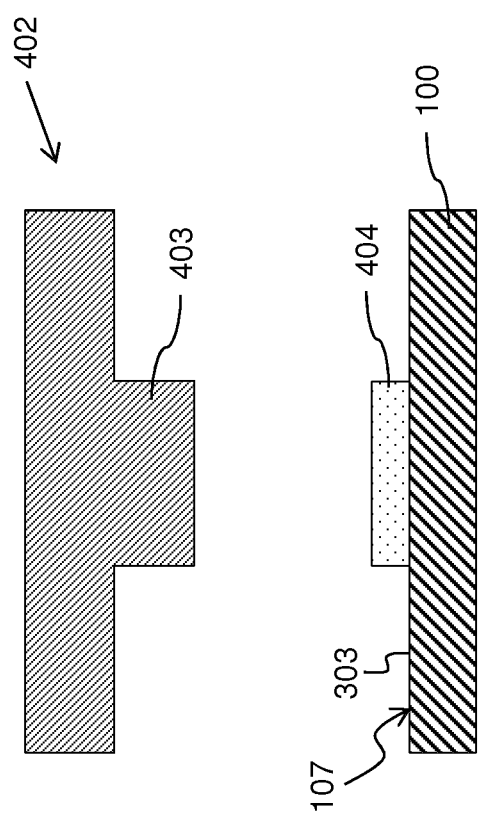

FIGS. 5A-5C illustrates a micro-contact transfer printing process for depositing fullerene on a surface of a substrate in one embodiment. Similarly to the shadow mask process, the micro-contact printing process may be used to selectively treat a portion of the surface by fullerene deposition.

FIG. 5A illustrates the first step of the micro-contact transfer printing process, wherein a stamp 402 having a protrusion 403 is provided with fullerene 404 on the surface of the protrusion 403. As will be understood by persons skilled in the art, fullerene 404 may be deposited on the surface of the protrusion 403 using known methods or processes.

As illustrated in FIG. 5B, the stamp 402 is then brought into proximity of the substrate 100, such that the fullerene 404 deposited on the surface of the protrusion 403 is in contact with the surface 107 of the substrate 100. Upon the fullerene 404 contacting the surface 107, some or all of the fullerene 404 becomes adhered to the surface 107 of the substrate 100.

As such, when the stamp 402 is moved away from the substrate 100 as illustrated in FIG. 5C, some or all of the fullerene 404 is effectively transferred onto the surface 107 of the substrate 100.

Figure 6:
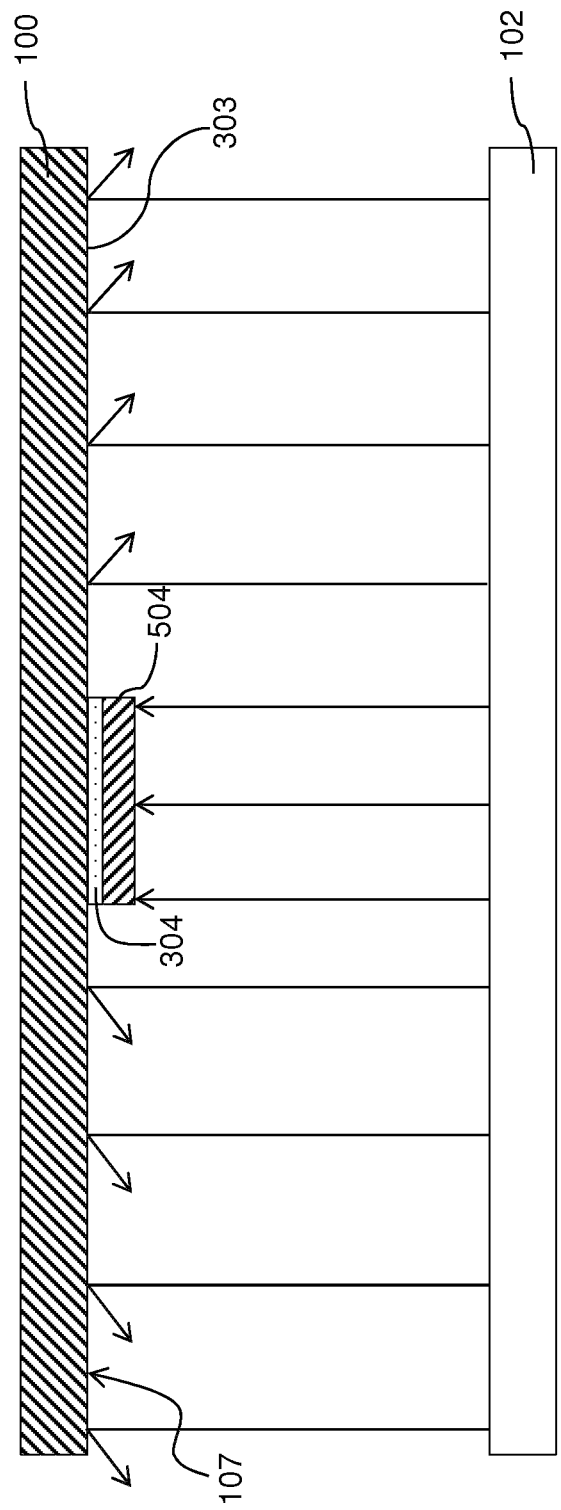
FIG. 6 is diagram illustrating a process for depositing magnesium on a fullerene treated surface of a substrate according to one embodiment.

Once fullerene has been deposited on the surface 107 of the substrate 100, magnesium may be deposited on the fullerene-treated areas of the surface 107. Turning to FIG. 6, a magnesium source 102 is illustrated as directing evaporated magnesium towards the surface 107 of the substrate 100. Particularly in cases where the surface 107 is an organic surface, magnesium deposits on the fullerene-treated areas of the surface but not on the untreated areas 303 of the surface as explained above. As such, the magnesium source 102 may direct evaporated magnesium towards both the treated and untreated areas of the surface 107 to selectively deposit magnesium on the fullerene-treated areas of the surface 107. In FIG. 6, the fullerene-treated area of the surface 107 is illustrated by fullerene 304 deposited on the surface 107. It will be appreciated that although the shadow mask patterning and the micro-contact transfer printing processes have been illustrated and described above, other methods and processes may be employed for selectively patterning the substrate 100 by depositing fullerene. For example, photolithography or reel-to-reel printing may be used to pattern the substrate with fullerene.

In one aspect, a method for reducing deposition of magnesium on a shadow mask is provided, the method comprising coating at least a portion of the surface of the shadow mask with an organic coating.

Although the shadow mask deposition process has been described in relation to deposition of fullerene above, it will be appreciated that the process may be similarly applied for deposition of other materials such as magnesium. For example, magnesium may be selectively deposited on a surface by directing evaporated magnesium through the aperture or gap formed on a shadow mask. The deposition process may also be repeated using the same shadow mask to selectively deposit magnesium onto other surfaces. However, one disadvantage of repeatedly using the same shadow mask for deposition is that the material being deposited may deposit on the perimeter of the aperture or gap of the shadow mask, thus modifying the shape or pattern of the aperture or gap. This is problematic for many applications, as the resulting patterns or shapes of material deposited on substrates using the same shadow mask will vary in accordance with the build-up of the deposition material. Build-up of the deposition material around the perimeter of the aperture or gap can also be difficult and/or uneconomical to remove. As such, in many cases, once the build-up of deposition material has caused the quality of a shadow mask to be reduced below a predetermined threshold, the shadow mask is discarded. This practice increases both waste and the costs associated with such deposition processes.

However, it has now been found that by applying an organic coating exhibiting poor adhesion to magnesium on a shadow mask, build-up of magnesium around the aperture or gap of the shadow mask can be reduced or potentially even eliminated. Moreover, should the mask eventually require cleaning, the organic coating may be evaporated or dissolved to remove the organic coating and any material deposited thereon from the surface of the shadow mask. If desired, a fresh organic coating may then be applied to the shadow mask for further use.

Figure 7:
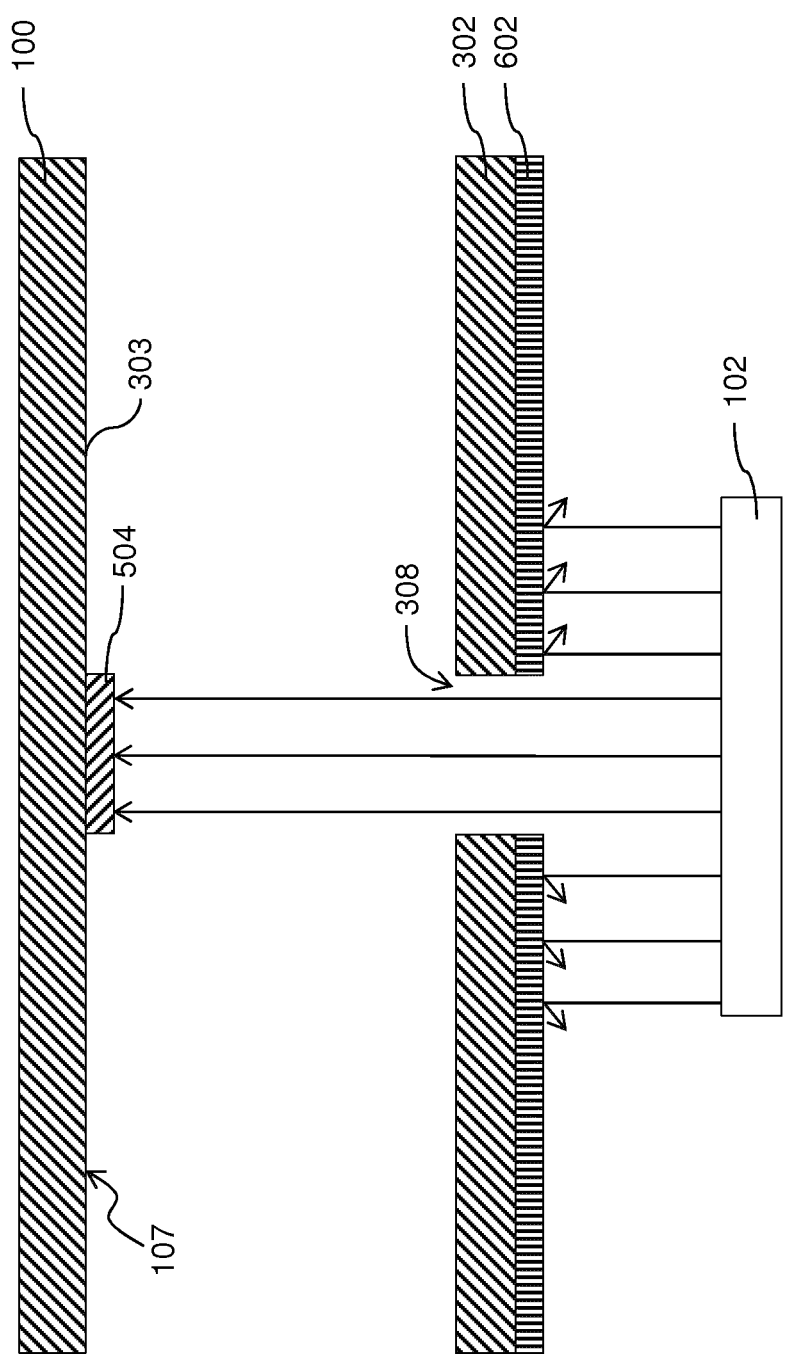
FIG. 7 is a diagram illustrating a shadow mask deposition process wherein the shadow mask has been treated with an organic coating to reduce adhesion of magnesium to the shadow mask.

Referring now to FIG. 7, a shadow mask 302 comprising an aperture or gap 308 and an organic coating 602 covering at least a portion of the surface of the shadow mask 302 is provided. In the illustrated embodiment, the organic coating 602 is provided for covering the surface of the shadow mask 302 facing the magnesium source 102 to reduce the likelihood of magnesium depositing on the surface of the shadow mask 602. As explained above, the shadow mask allows passage of evaporated magnesium through the aperture 308 to be deposited on the substrate surface 100, but inhibits passage of evaporated magnesium incident on the coated surface of the shadow mask 302. More specifically, as illustrated in FIG. 7, magnesium incident on the organic coating 602 does not adhere or deposit on the surface of the organic coating 602 and therefore ensures that there is little or no buildup of magnesium around the perimeter of the aperture or gap 308 to distort the intended pattern or shape of the aperture or gap 308.

Figure 8:
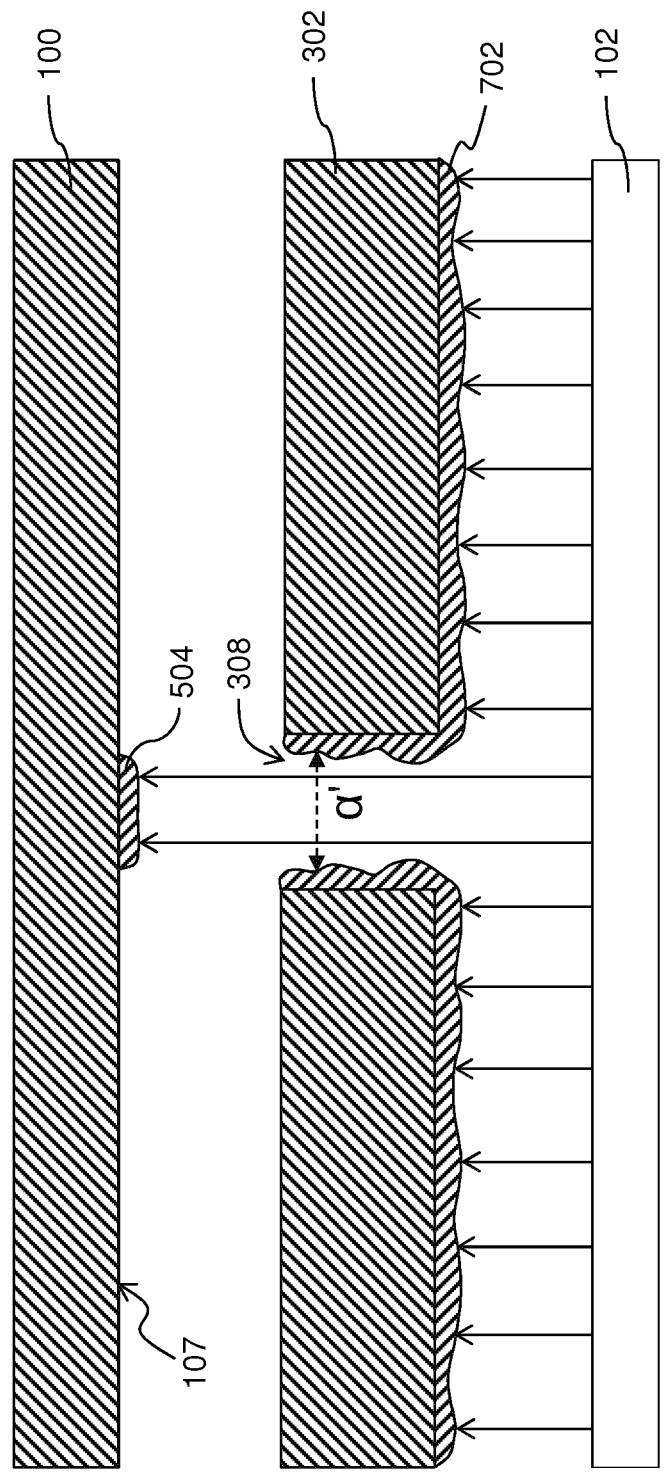
FIG. 8 is a diagram illustrating a shadow mask deposition process wherein the shadow mask has not been treated with the organic coating.
Figure 9:
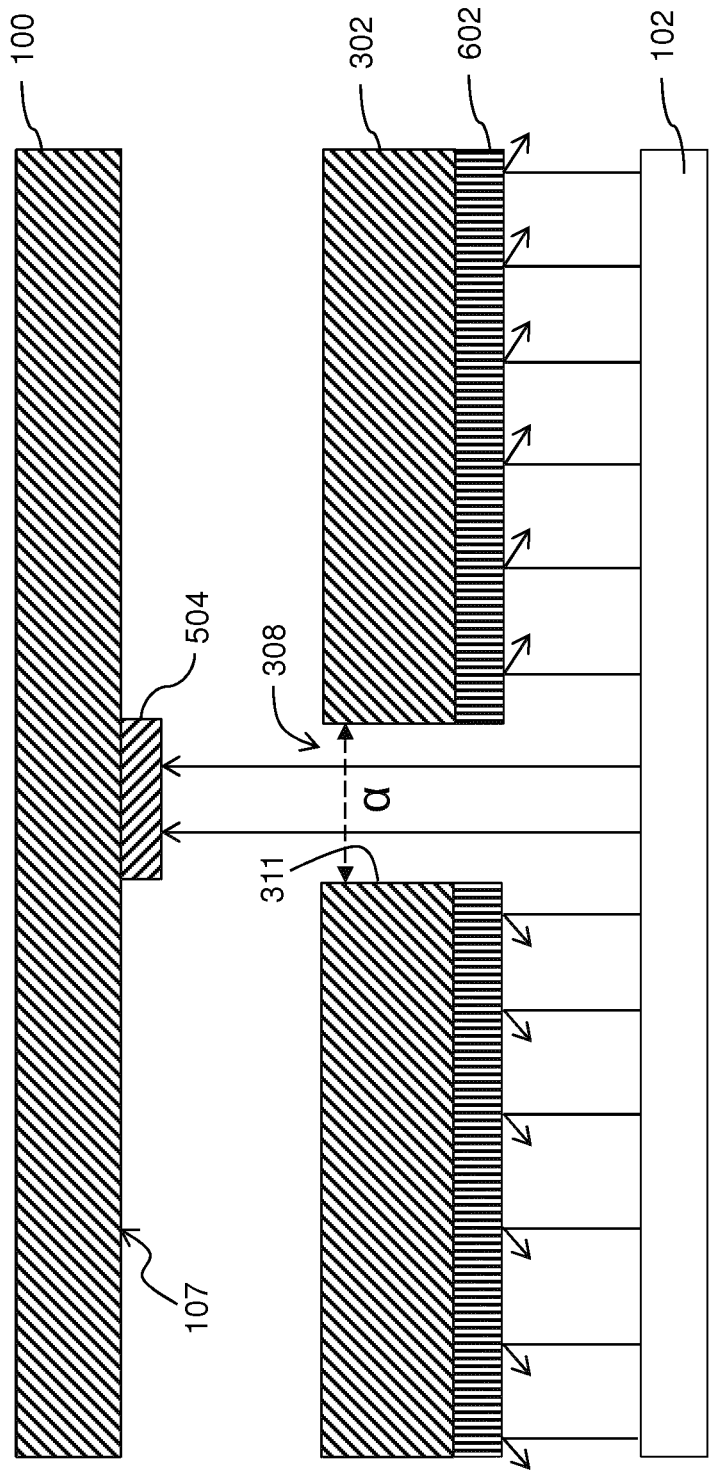
FIG. 9 is a diagram illustrating a shadow mask deposition process wherein the shadow mask has been treated with the organic coating in one embodiment.

For comparison purposes, FIG. 8 illustrates a cross-section of an uncoated shadow mask being used to deposit magnesium. As the shadow mask is typically made of inorganic materials such as metals, magnesium build-up 702 may form over repeated deposition. As can be seen from the figure, repeated use of the shadow mask 302 has reduced the width of the aperture to α' by formation of the magnesium build-up 702 on the perimeter of the aperture or gap 308. In comparison, FIG. 9 illustrates a shadow mask 302 having an organic coating 602 to reduce or eliminate magnesium build-up on its surface. As illustrated in FIG. 9, magnesium incident on the organic coating does not adhere to the organic surface. As such, there is no buildup of magnesium in the perimeter 311 of the aperture 308 and consequently, the width of the aperture α is maintained.

Although not illustrated in the figures, it will be appreciated that other parts of the shadow mask 302 may additionally be coated. For example, the perimeter 311 of the aperture or gap 308 may be coated with organic coating.

It will be appreciated that the organic coating may comprise any organic material. For example, the organic coating may comprise an organic material commonly used as the active layer of organic photovoltaic device. Examples of organic material which may be used as the organic coating include polytetrafluoroethylene (PTFE) and silicon or silicone-based polymers.

It will also be appreciated that the selective magnesium deposition process using shadow mask as described above may be used to deposit magnesium on a fullerene-treated surface as described above or any other surfaces on which magnesium may be deposited.

Although the above method of reducing deposition of magnesium on a surface is described with reference to a shadow mask, it will be appreciated that other deposition apparatuses and/or components may be treated with an organic coating to reduce the deposition of magnesium on surfaces of such apparatuses and/or components. For example, the viewing window of a chamber or the walls of a baffle system may similarly be coated with an organic coating to reduce the undesired build-up of magnesium on particular surfaces.

In another aspect, an organic electronic device is provided, the organic electronic device comprises an anode and a cathode, the cathode comprising magnesium, an organic semiconductor layer interposed between the anode and the cathode, and fullerene disposed between the organic semiconductor layer and the cathode.

In yet another aspect, an organic optoelectronic device is provided, the organic optoelectronic device comprising an anode and a cathode, the cathode comprising magnesium, an organic semiconductor layer interposed between the anode and the cathode, and fullerene disposed between the organic semiconductor layer and the cathode.

As is known, an optoelectronic device is generally any device that converts electrical signals into photons or vice versa. As such, an organic optoelectronic device, as used herein, will be understood to be any optoelectronic device where the active layer(s) of the device are formed primarily of organic materials, and more specifically, organic semiconductor materials. Examples of organic optoelectronic devices include, but are not limited to, organic light emitting diodes (OLEDs) and organic photovoltaic (OPV) cells.

In one embodiment, the organic optoelectronic device is an organic light emitting diode, wherein the organic semiconductor layer comprises an electroluminescent layer. In other embodiments, the organic semiconductor layer may comprise additional layers, such as an electron injection layer, electron transport layer, hole transport layer, and/or hole injection layer.

In one embodiment, fullerene is disposed at the interface formed between the organic semiconductor layer and the cathode. In some cases where the organic semiconductor layer comprises additional layers, fullerene may be disposed at the interface between the layer closest to the cathode and the cathode. For example, fullerene may be disposed at the interface created between an electron injection layer and the cathode.

In one embodiment, the organic optoelectronic device further comprises a getterer, the getterer comprising magnesium. In another embodiment, the getterer is formed integral with the conductive layer. The getterer may be formed integral with the conductive layer by, for example, depositing a relatively thick conductive layer such that a portion of the conductive coating acts as the getterer. For example, the conductive coating may be several hundred nanometers, several hundred microns, or more to enable long-term gettering of water vapor and oxygen which may be present in the packaged product.

Providing a getterer in phosphorescent OLED devices may be particularly beneficial, as phosphorescent OLED devices contain phosphorescent emitting layers which may be quenched in the presence of oxygen. By providing a getterer, the concentration of oxygen within a packaged environment for the phosphorescent OLED device may be comparatively reduced, thus reducing the rate of degradation of the phosphorescent emitting layer.

It will be appreciated that, as used herein, fullerene will be understood to be any carbon-based molecule in the form of a hollow sphere, ellipsoid, tube, or any other three dimensional shapes. More specifically, fullerene will be understood to include carbon-based molecules whose atoms are arranged in closed hollow spheres, as well as carbon-based molecules whose atoms form elongated hollow tubular structures. As such, examples of fullerene include, but are not limited to, buckminsterfullerene (i.e. $C_{60}$), $C_{70}$, $C_{76}$, $C_{84}$, multi-wall and single-wall carbon nanotubes (CNTs), including conducting and semiconducting carbon nanotubes. It will also be understood that fullerene may also be a combination or mixture of several different types of fullerenes. Furthermore, it will be appreciated that fullerene derivatives such as functionalized fullerenes, as well as doped fullerenes, may be used for purposes of the present invention. As such, fullerene molecules may comprise various functional groups and/or non-carbon atoms. For example, phenyl-C61-butyric acid methyl ester (PCBM) may be used as the fullerene.

It will also be appreciated that the magnesium described herein may be substantially pure magnesium or a magnesium alloy. It will be appreciated that the purity of a substantially pure magnesium may be above 95%, 98%, 99%, 99.9%, or higher. A magnesium alloy may comprise various magnesium alloys known in the art.

Examples

Aspects of the invention will now be illustrated with reference to the following examples, which are not intended to limit the scope of the invention in any way.

Molecular structures of the different organic materials used in the illustrative examples are provided below.

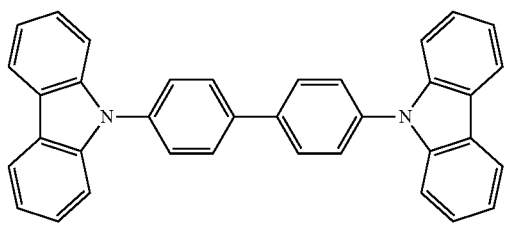

CBP

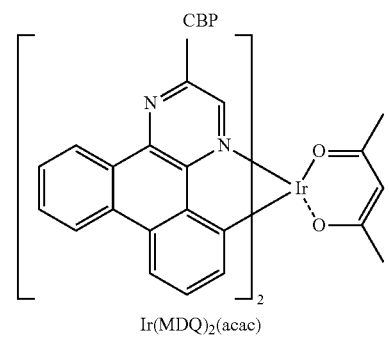

Ir(MDQ)$_2$(acac)

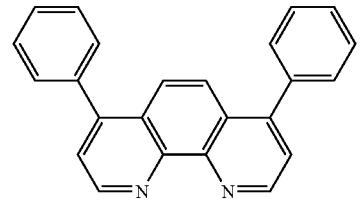

Bphen

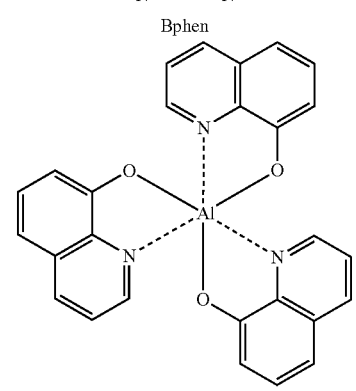

Alq$_3$

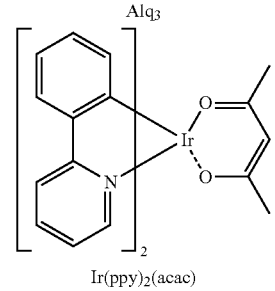

Ir(ppy)$_2$(acac)

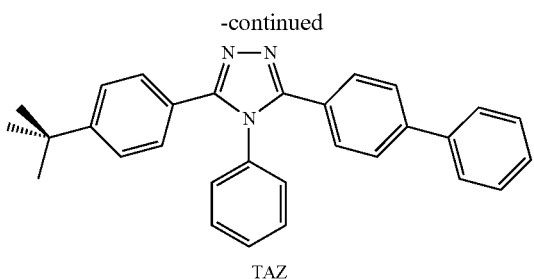

TAZ

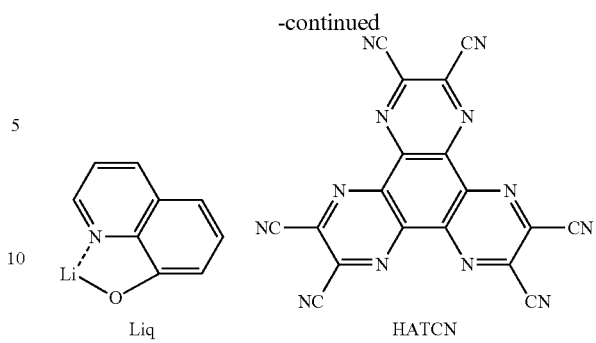

Liq    HATCN

TPBi

TmPyPB

BNPB

As will be understood, CBP is 4,4'-bis(N-carbazolyl)-1,1'-biphenyl, $Alq_3$ is tris(8-hydroxy-quinolinato)aluminium, TPBi is 1,3,5-tris-(N-phenylbenzimidazole-2-yl)-benzene, $Ir(MDQ)_2(acac)$ is bis(2-methyldibenzo[f,h]quinoxaline) (acetylacetonate)iridium(III), $Ir(ppy)_2(acac)$ is bis(2-phenylpyridine)(acetylacetonate)iridium(III), TmPyPB is 1,3,5-tri[(3-pyridyl)-phen-3-yl]benzene, Bphen is 4,7-diphenyl-1,10-phenanthroline, TAZ is 3-(4-biphenyl)-4-phenyl-5-tert-butylphenyl-1,2,4-triazole, BNPB is $Mes_2B$ [p-4,4'-biphenyl-NPh(1-naphthyl)], and NPB is N,N'-di(naphthalen-1-yl)-N,N'-diphenyl-benzidine, Liq is 8-Hydroxyquinolinolato-lithium, HATCN is hexacarbonitrile, and a-NPD is 4,4-bis[N-(1-naphthyl)-N-phenyl-amino]biphenyl.

Figure 10:
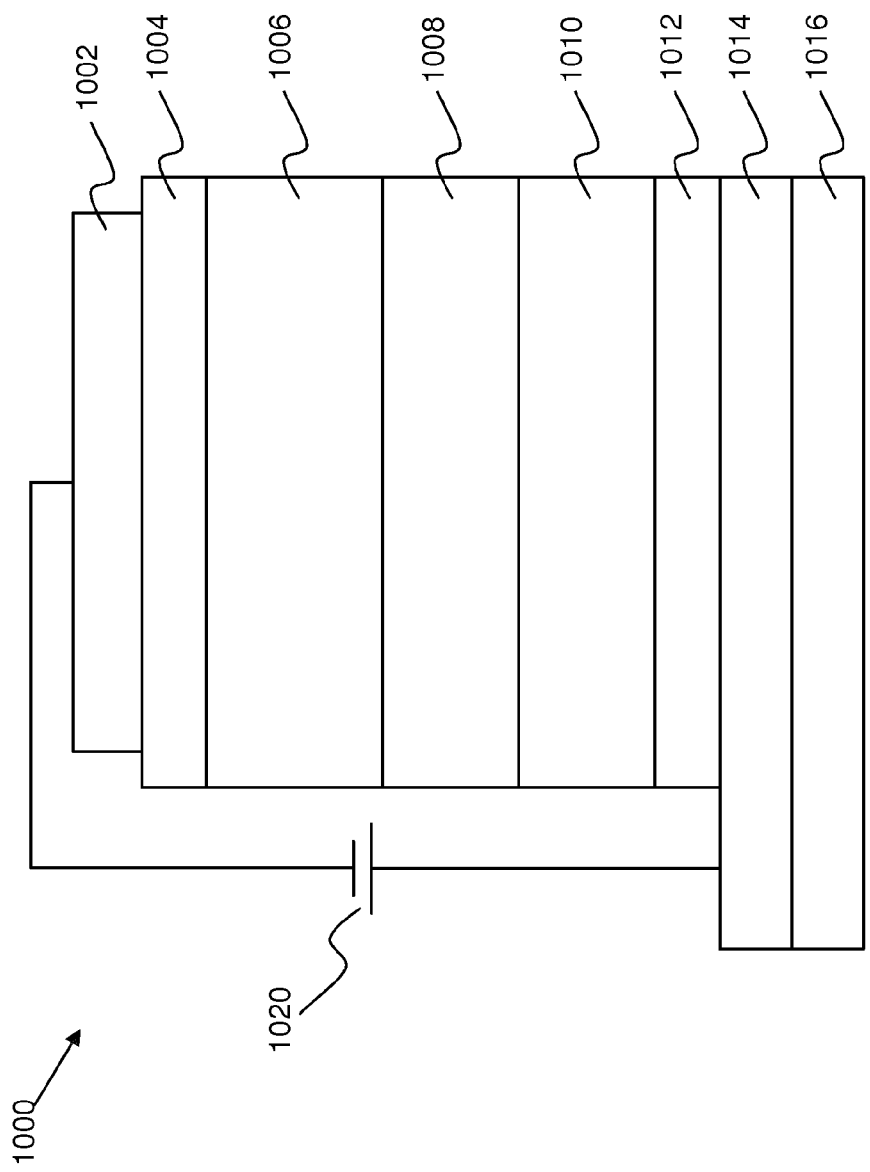
FIG. 10 is a device structure diagram of an example red phosphorescent organic light emitting diode (OLED)

Turning now to FIG. 10, an example red phosphorescent OLED 1000 comprising a magnesium cathode is provided. The OLED device 1000 was constructed according to the following procedure. A transparent conducting anode of indium-doped tin oxide (ITO) 1014 coated on a glass substrate 1016 was ultrasonically cleaned with a standard regiment of Alconox™ dissolved in deionized (DI) water, acetone, and methanol. The ITO substrate 1014 was then subjected to a UV ozone treatment for 15 minutes in a Photo Surface Processing Chamber (Sen Lights). A 1 nm-thick high work function $MoO_3$ layer 1012 was then deposited on the ITO anode 1014.

A 50 nm-thick CBP hole transporting layer (HTL) 1010 was then deposited on the $MoO_3$ layer 1012. A 15 nm-thick red emissive layer of CBP host doped with the phosphorescent red emitter $Ir(MDQ)_2(acac)$ 1008 was deposited on the CBP layer 1010. The CBP host was doped to a concentration of 4 wt %.

A 65 nm-thick TPBi electron transporting layer (ETL) 1006 was deposited on the red phosphorescent emissive layer 1008. A 1 nm-thick LiF layer 1004 was deposited on the TPBi layer 1006. A 100 nm-thick Al or Mg cathode layer 1002 was deposited on the LiF layer. In the case of the magnesium cathode, a 1 angstrom-thick fullerene adhesion promoting layer comprising $C_{60}$ was deposited on top of the LiF layer prior to deposition of magnesium. When various attempts at fabrication of the device were made without using the fullerene adhesion promoting layer, the magnesium either did not adhere to the substrate during the deposition process or was deposited as a non-conductive oxide layer which rendered the device inoperable. The OLED 1000 was driven by a power source 1020.

Although the LiF layer 1004 was deposited prior to deposition of fullerene in the above example, it has also been found that the LiF layer may be deposited between the deposition of fullerene and magnesium and still result in successful deposition of magnesium. The inventors postulate that this may be the result of the relatively small LiF molecules migrating through the deposited fullerene to occupy interstitial sites within the fullerene adhesion promoting layer, thus exposing some fullerene molecules on the surface, which act as the nucleation sites for subsequent deposition of magnesium.

It will be appreciated that various other materials may be used for the electron injection layer (EIL). For example, 8-Hydroxyquinolinolatolithium (Liq) and LiF are common EIL materials. Other examples of suitable materials for use as the EIL include, but are not limited to, metal fluorides (such as LiF, NaF, KF, RbF, CsF, $BaF_2$), caesium carbonate ($Cs_2CO_3$), lithium cobalt oxide ($LiCoO_2$), $LiO_2$, pure metals (e.g. Ca and Cs) and organic materials doped with n-type dopants. However, it will be appreciated by those skilled in the art that various other EIL materials may be used. It will also be appreciated that, depending on the specific construction of an OLED device, the EIL layer may not be present.

It will also be understood that although the LiF layer may be deposited prior to or after the deposition of the fullerene adhesion promoting layer, the order of deposition of other EIL materials may have a more significant effect on the subsequent deposition of magnesium and the operation of the resulting OLED devices. In particular, as mentioned above, it is postulated that the small size of the LiF molecules enable LiF to migrate through interstices of the fullerene adhesion promoting layer. However, the ability of other materials suitable for use as the EIL to pass through interstices of the fullerene adhesion promoting layer will depend on the sizes of the molecules, density and size of the fullerene in the adhesion promoting layer, and other specific properties of the fullerene and the EIL material.

The devices constructed according to the above process were characterized to determine the comparative performance of OLED devices comprising magnesium cathodes against identical OLED devices comprising aluminum cathodes for the device structure of FIG. 10. As will be further described herein, various other OLED devices were constructed to further analyze the effects of providing fullerene in OLED devices having magnesium cathodes.

Figure 11:
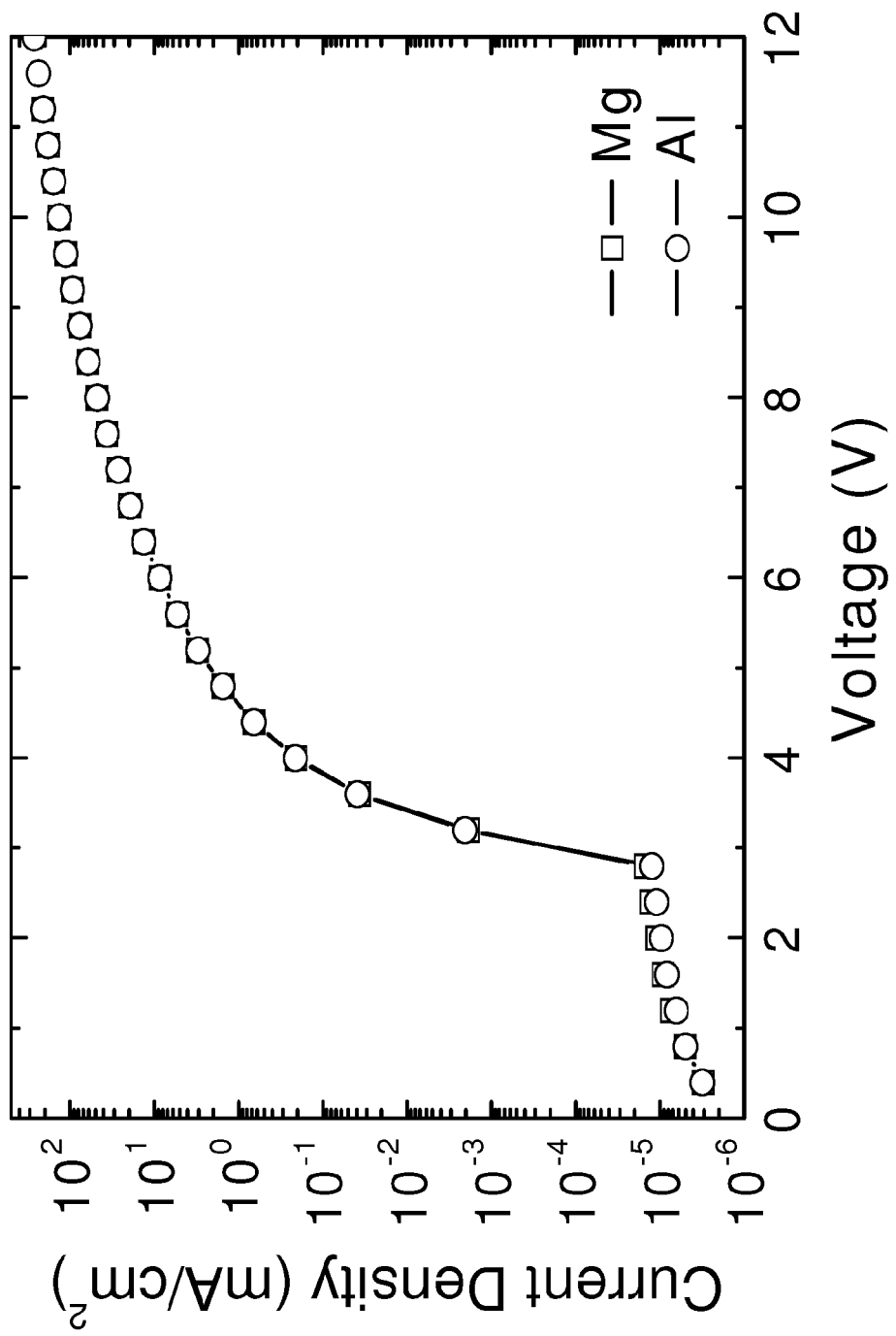
FIG. 11 is a plot showing the relationship between current density and voltage a first OLED device of FIG. 10 comprising a magnesium cathode and a second OLED device of FIG. 10 comprising an aluminum cathode.

FIG. 11 shows a plot of current density as a function of voltage for the red phosphorescent OLED devices 1000 of FIG. 10 having either aluminum or magnesium cathodes. As can be seen from the plot, the current density of the OLED device comprising a magnesium cathode is almost indistinguishable from the current density of the OLED device comprising an aluminum cathode across a wide voltage range. These similar results confirm that the charge injection property of the magnesium electrode is similar to that of the aluminum electrode in the OLED device 1000.

The normalized electroluminescence intensities as a function of wavelength for the red phosphorescent OLED devices comprising aluminum and magnesium cathodes were measured using an OceanOptics USB4000 Fiber Optic Spectrometer with integrating sphere. Each of the OLED devices was mounted on the entrance aperture of the integrating sphere during the measurement.

Figure 12:
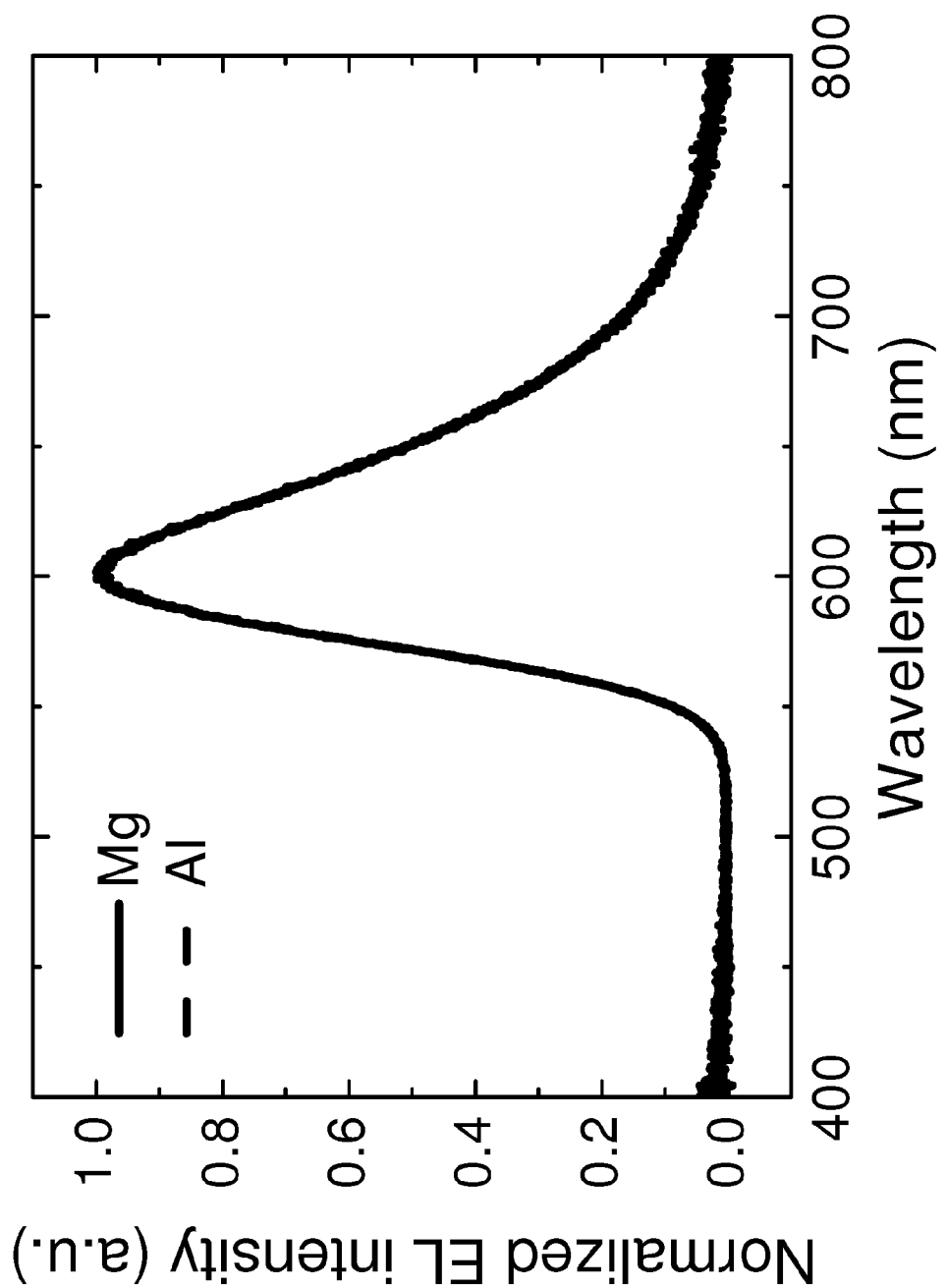
FIG. 12 is a chart showing the relationship between normalized electroluminescence intensity and wavelength for two OLED devices, the first device comprising a magnesium cathode and the second device comprising an aluminum cathode.

As can be seen from the plot of FIG. 12, the normalized electroluminescence intensity as a function of wavelength is nearly identical for both devices. Specifically, the OLED device comprising the magnesium cathode shows nearly identical electroluminescence intensity across the entire visible spectrum to that of the equivalent device having the aluminum cathode. In particular, the emission peak at 600 nm is observed for both devices, indicating that the colour of light produced by the device is not significantly shifted by the choice of the cathode material when selecting between magnesium and aluminum.

Figure 13:
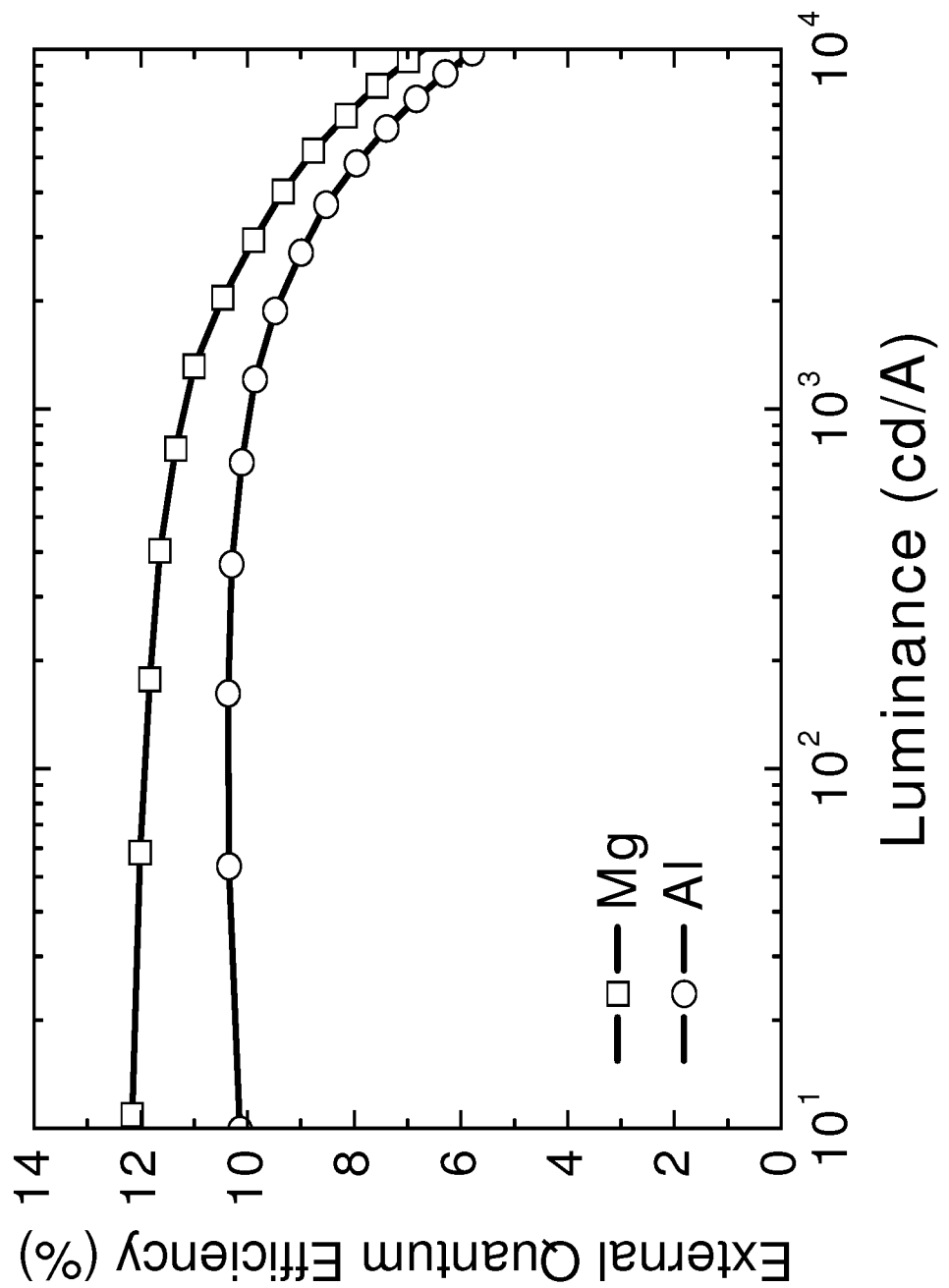
FIG. 13 is a chart showing the relationship between external quantum efficiency (EQE) and luminance for two OLED devices, the first device comprising a magnesium cathode and the second device comprising an aluminum cathode.

An important measure of OLED device efficiency is the external quantum efficiency (EQE). FIG. 13 shows a plot of the EQE with respect to luminance for OLED devices having the structure illustrated in FIG. 10. The first device comprised a magnesium cathode, and the second device comprised an aluminum cathode. Similarly with the electroluminescence intensity results, the EQE was measured using an OceanOptics USB4000 Fiber Optic Spectrometer with integrating sphere. As can be seen from the plot of FIG. 13, although both devices become less efficient as the luminance is increased, the device with the magnesium cathode generally exhibited higher EQE compared to the device with the aluminum cathode.

For example, at a luminance of 1000 cd/A, the device comprising the magnesium cathode exhibited an EQE of approximately 11.25%, whereas the equivalent device having the aluminum cathode exhibited an EQE of approximately 9.75%. This suggests that the use of a magnesium cathode over an aluminum cathode enhances the EQE of an OLED device in the present example.

This improved EQE may be explained by a higher reflectivity of magnesium compared to that of aluminum at an emission peak of 600 nm, which corresponds to the peak wavelength emitted by these devices, as shown in FIG. 12. The higher reflectivity causes greater proportion of photons incident on the cathode to be reflected and thus increases the likelihood of the reflected photons exiting the device through the optically-transparent anode 1014. As the EQE is a percentage of the number of photons that are emitted by the device over the number of total charges that are injected into the device, it will be understood that having a more reflective cathode can result in an increase of the EQE of the device.

Figure 14:
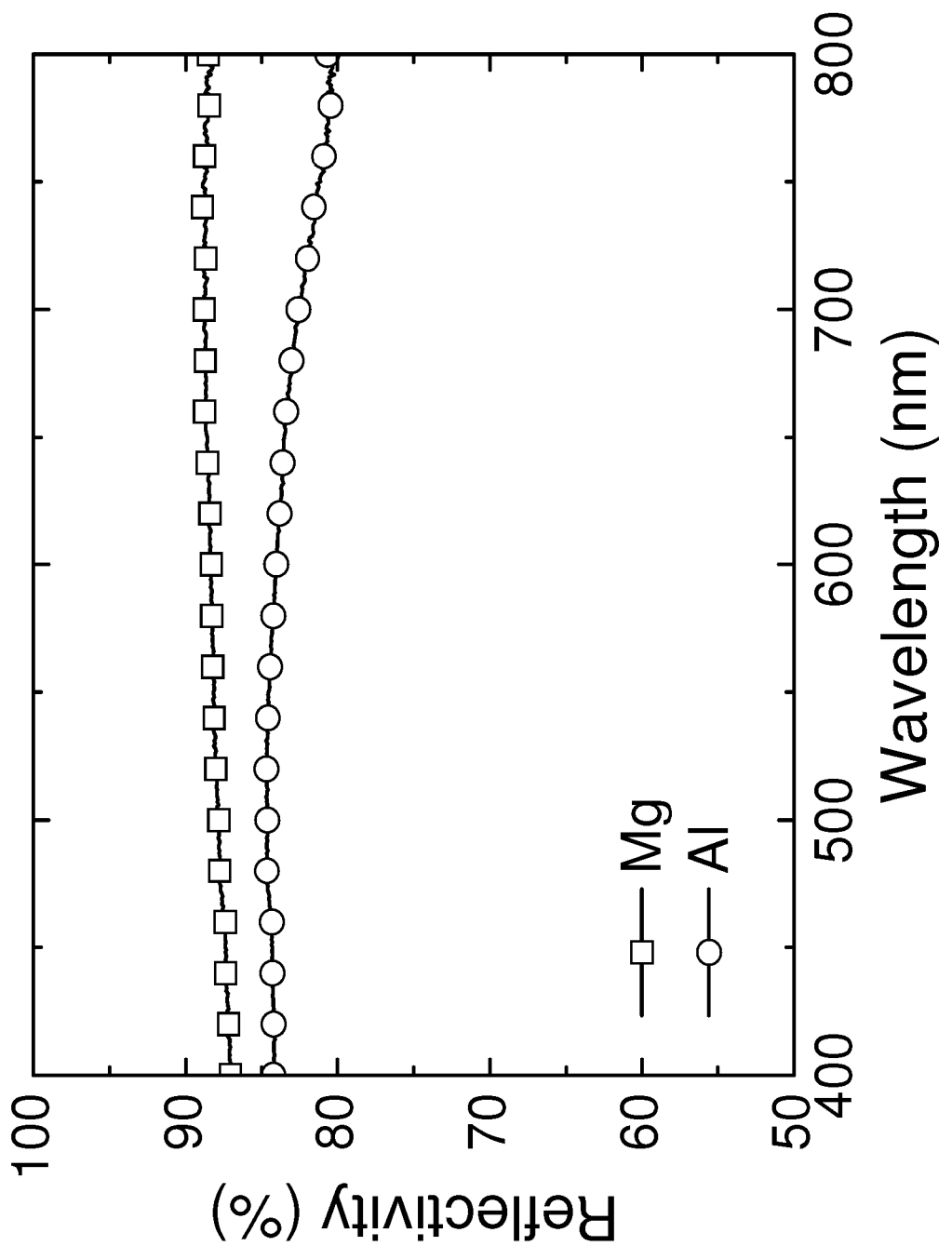
FIG. 14 is a chart showing the relationship between reflectivity and wavelength for magnesium and aluminum thin films deposited on glass.

The reflectivities of magnesium and aluminum were measured, and as shown in FIG. 14, the reflectivity of magnesium was found to be greater than the reflectivity of aluminum over the entire visible spectrum (including at 600 nm). To obtain the plot of FIG. 14, aluminum and magnesium films having thicknesses of about 100 nm were deposited on glass substrates and the reflectivities of the films were measured using a PerkinElmer LAMBDA 1050 UV/Vis/NIR Spectrophotometer with 150 mm integrating sphere accessory. It is noted that a 10 Å thick fullerene adhesion promoting layer was deposited on the glass substrate prior to deposition of magnesium. The reflectivities of the films were measured from the glass side of the film, and the results were not corrected for the reflection at the air/glass interface, which is estimated to be approximately 4%.

From FIG. 14, it can be seen that the reflectivity of magnesium is higher than that of aluminum across the entire visible spectrum. In particular, at longer wavelengths of the visible spectrum, which corresponds to red region of the spectrum, the differences in the reflectivity become more pronounced. The results provided in FIG. 14 suggest that a device with a magnesium cathode may exhibit comparatively superior optical out-coupling compared to a device with an aluminum cathode, particularly for red OLED devices.

Figure 15:
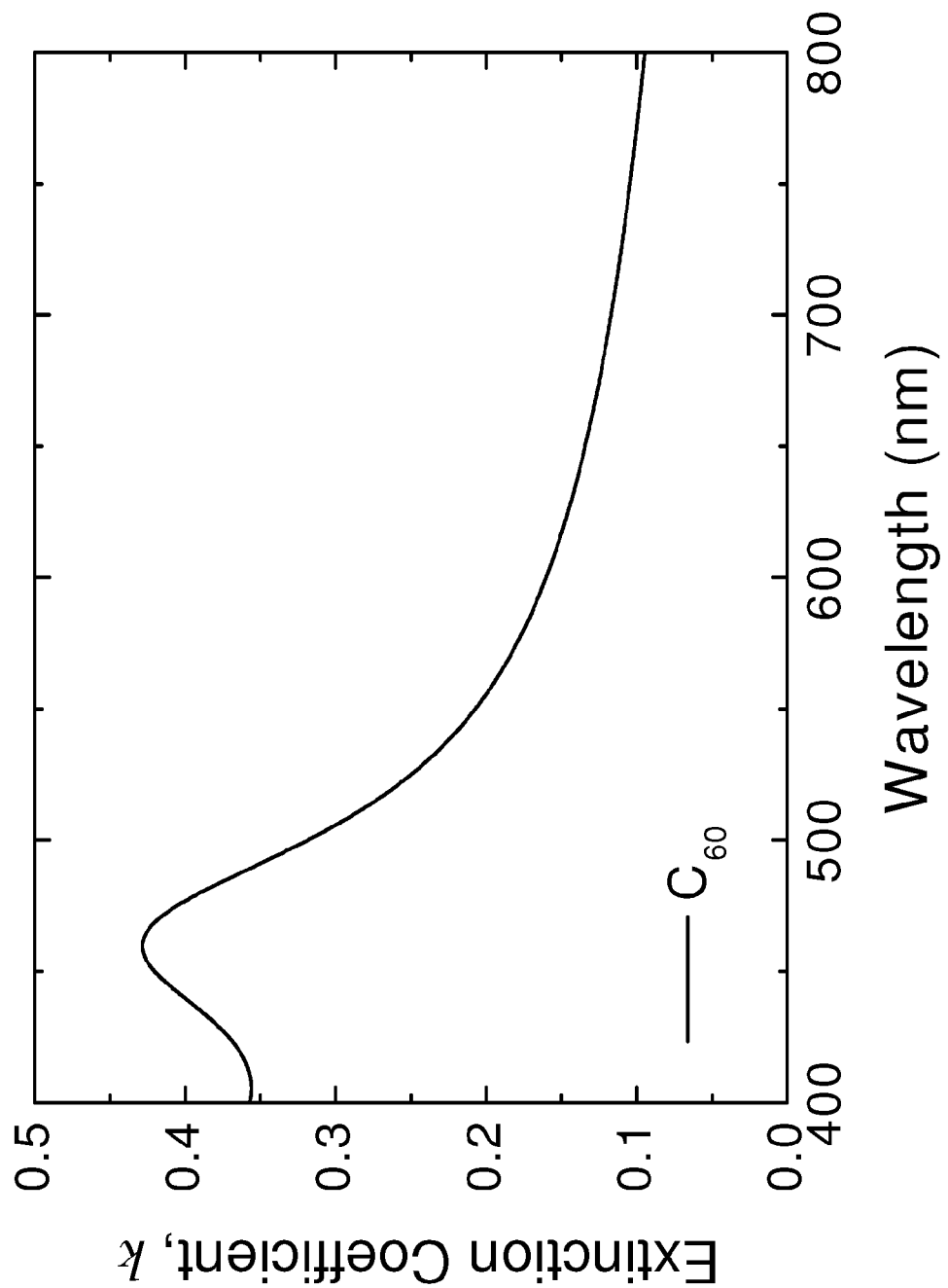
FIG. 15 is a chart showing the relationship between the extinction coefficient and wavelength for buckminsterfullerene.

It has also been observed that the extinction coefficient, k, of $C_{60}$ is the highest around the blue region of the visible spectrum. As will be appreciated, the extinction coefficient refers to the imaginary component of the refractive index of a material. A plot of k with respect to wavelength for a $C_{60}$ sample is shown in FIG. 15. The extinction coefficient was measured using spectroscopic ellipsometry.

From FIG. 15, it can be seen that $C_{60}$ absorbs more in the blue region of the visible spectrum (i.e. from about 400 to 500 nm) than in the green or red regions of the visible spectrum (i.e. from about 500 to 800 nm). This suggests that the output of a red OLED device with a magnesium cathode will be affected less by absorbance of light by the $C_{60}$ adhesion promoting layer compared to the output of an identical blue OLED device. Although the absorbance is higher in the blue region of the visible spectrum for $C_{60}$, it is noted that the effect of light absorbance by the fullerene adhesion promoting layer may be reduced by using a very thin adhesion promoting layer of, for example, approximately 1 angstrom. In devices where fullerene is dispersed throughout the magnesium-based cathode, the concentration of fullerene in the cathode may be kept low to reduce the absorbance of light across the visible spectrum.

TABLE 2

Example OLED Device Structures for Cathode Material Characterization

| Emitter Material | Device Structure |
|---|---|
| Ir(MDQ)$_2$(acac) | ITO/MoO$_3$ (1 nm)/CBP (50 nm)/ CBP:Ir(MDQ)$_2$(acac) (4%, 15 nm)/TPBi (65 nm)/ LiF (1 nm)/Cathode (100 nm) |
| Alq$_3$ | ITO/MoO$_3$ (1 nm)/NPB (45 nm)/Alq$_3$ (60 nm)/ LiF (1 nm)/Cathode (100 nm) |
| Ir(ppy)$_2$(acac) | ITO/MoO$_3$ (1 nm)/ CBP (35 nm)/CBP:Ir(ppy)$_2$(acac) (8%, 15 nm)/ TPBi (65 nm)/LiF (1 nm)/Cathode (100 nm) |
| BNPB | ITO/MoO$_3$ (1 nm)/CBP (40 nm)/ TPBi:BNPB (10%, 10 nm)/TPBi(60 nm)/ LiF (1 nm)/Cathode (100 nm) |

TABLE 3

Performance of OLED devices of Table 2

| Emitter Material | Emission Peak (nm) | EQE (%) at 1,000 cd/m$^2$ for Al Cathode | EQE (%) at 1,000 cd/m$^2$ for Mg Cathode |
|---|---|---|---|
| Ir(MDQ)$_2$(acac) | 600 | 9.9 | 11.2 |
| Alq$_3$ | 526 | 1.3 | 1.3 |
| Ir(ppy)$_2$(acac) | 522 | 24.2 | 24.2 |
| BNPB | 456 | 3.1 | 3.1 |

Provided in Table 2 are four device structures used to compare the performance of a magnesium cathode with respect to an aluminum cathode. Specifically, OLED devices were constructed in accordance with the device structures listed in Table 2 using either a magnesium cathode or an aluminum cathode. Table 2 also lists the emitter material used in constructing each of the devices. Ir(MDQ)$_2$(acac) and Ir(ppy)$_2$(acac) are commonly used red and green phosphorescent emitters, respectively. Alq$_3$ and BNPB are commonly used green and blue fluorescent emitters, respectively. As in the example device illustrated in FIG. 10, a 1 angstrom thick $C_{60}$ layer was deposited on the LiF layer prior to deposition of the magnesium film in constructing each device.

Table 3 shows device performance characteristics for each of the devices outlined in Table 2. The emission peak for each device was determined from the electroluminescence spectrum measured using an OceanOptics USB4000 Fibre Optic Spectrometer with integrating sphere. The external quantum efficiency was also measured using an OceanOptics USB4000 Fibre Optic Spectrometer with integrating sphere. Luminance was measured using a Minolta LS-110 Luminance Meter.

From the EQE measurement results provided in Table 3, is can be seen that devices having magnesium cathodes exhibited approximately the same efficiencies as devices having aluminum cathodes. The red emitter OLED device comprising the Ir(MDQ)$_2$(acac) emitter with a magnesium cathode was observed to exhibit a slightly higher EQE compared to the equivalent device having an aluminum cathode. As explained above, this may be attributed to the higher reflectivity of magnesium compared to that of aluminum in the red region of the visible spectrum.

The results of Table 3 indicate that a magnesium cathode deposited over a fullerene adhesion promoting layer can effectively be used in place of an aluminum cathode for various device constructions and in conjunction with various emitter materials. The results of Table 3 also suggest that a magnesium cathode may be used in place of an aluminum cathode in OLED devices for emitting multiple colours, such as white OLED devices. Any colour shift in the emission spectrum due to differences in reflectivity could be overcome by optimizing the OLED device. A multi-emitter device (e.g. white OLED device) may also be calibrated following the fabrication.

TABLE 4

Comparison of Performance Characteristics for Mg vs. Al Cathodes in Devices Employing Various Electron Transport Layers

| Electron Transport Layer Material | EQE (%) at 1,000 cd/m$^2$ for Al Cathode | EQE (%) at 1,000 cd/m$^2$ for Mg Cathode |
|---|---|---|
| TPBi | 24.2 | 24.2 |
| Alq$_3$ | 22.5 | 21.7 |
| Bphen | 18.6 | 18.7 |
| TAZ | 20.4 | 19.6 |
| TmPyPb | 20.6 | 20.0 |

Comparison of device performance characteristics for devices comprising magnesium and aluminum cathodes in conjunction with various electron transport layers (ETLs) is provided in Table 4. As the ETL is in close proximity to the cathode, and because various ETL materials may be used depending on specific device constructions, it is advantageous to have a cathode material that can be used for a various materials commonly used as ETLs.

Specifically, various green phosphorescent OLED devices were constructed in accordance with the following device structure: ITO/MoO$_3$ (1 nm)/CBP (35 nm)/CBP:Ir(ppy)$_2$(acac) (8%, 15 nm)/TPBi (10 nm)/ETL (55 nm)/LiF (1 nm)/Cathode (100 nm), wherein the ETL material is one of the five materials listed in Table 4. A 1 angstrom thick $C_{60}$ adhesion promotion layer was deposited on top of the LiF layer prior to deposition of magnesium for each of the devices having magnesium cathodes. To enable similar comparison of performances for aluminum and magnesium cathodes, the thicknesses of ETL and the fullerene adhesion promoting layer were not optimized for any of the devices. As such, the device performance differs between each device due to differing mobility, optical properties, and interface characteristics of the different ETL materials. However, for purposes of comparing the performance of the magnesium cathode against the aluminum cathode, the variation in device performance due to the use of different ETL materials is irrelevant.

The EQEs provided in Table 4 were measured using an OceanOptics USB4000 Fibre Optic Spectrometer with integrating sphere. Luminance was measured using a Minolta LS-110 Luminance Meter. From the EQE measurements, it can be seen that devices having magnesium cathodes exhibited similar EQE as identical devices having aluminum cathodes. These results demonstrate that magnesium may be used to replace aluminum as a cathode material by using a fullerene adhesion promoting layer for devices with various ETL materials. Specifically, the EQEs of OLED devices were found to be not substantially affected by the choice of cathode between magnesium and aluminum for any of the ETL materials provided in Table 4.

Figure 16:
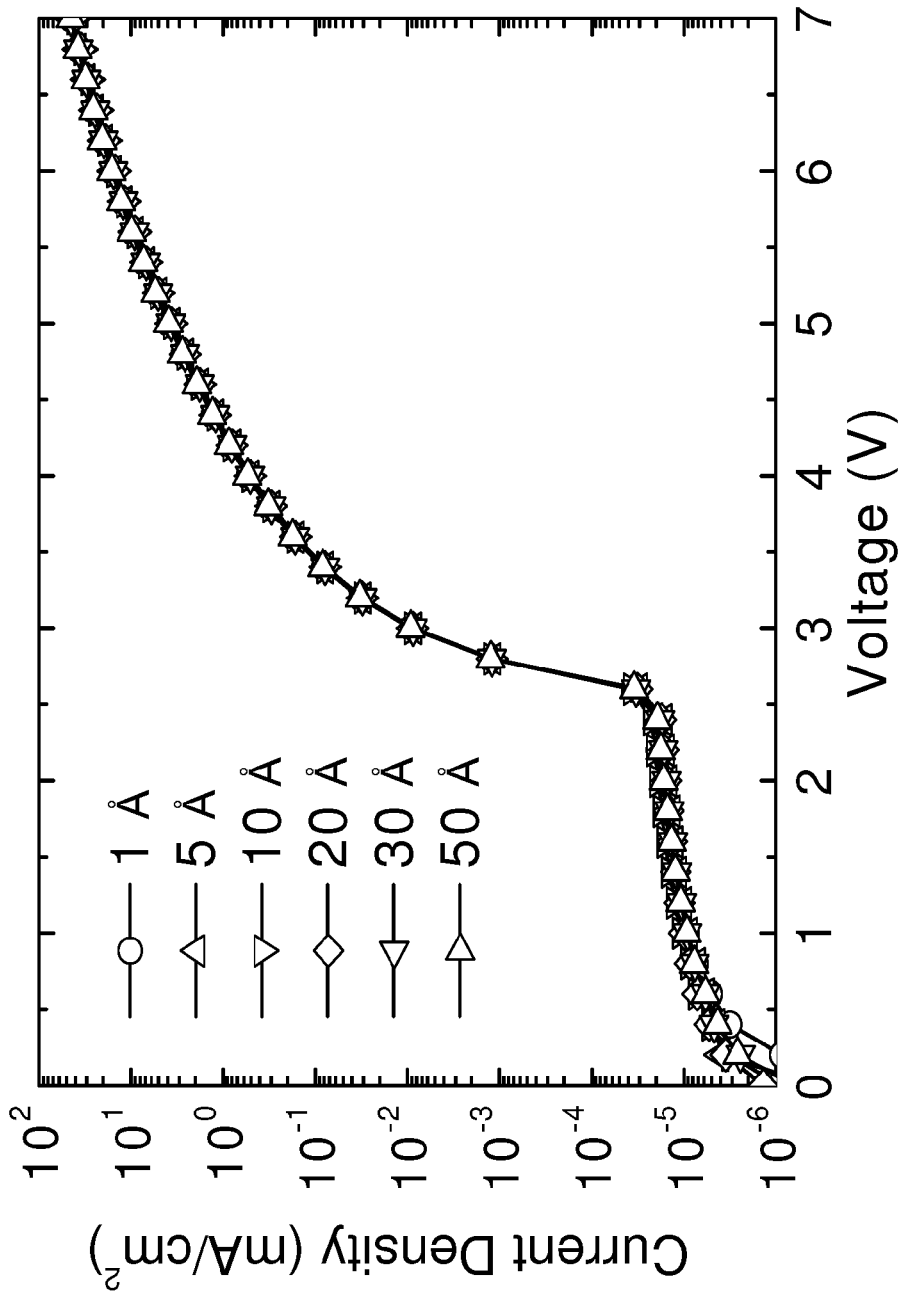
FIG. 16 is a chart showing the relationship between current density and voltage for OLED devices comprising magnesium cathodes deposited over fullerene layers of various thickness.

Referring now to FIG. 16, a plot of current density as a function of voltage for green phosphorescent OLEDs comprising fullerene adhesion promoting layers of various thicknesses (or coverage, in the case of sub-monolayer) is provided. Fullerene used in the present example consisted primarily of $C_{60}$, however, other types of fullerene may have also been present. The construction of devices used to obtain the results shown in FIG. 16 is as follows: ITO/$MoO_3$ (1 nm)/CBP (35 nm)/CBP:Ir(ppy)$_2$(acac) (8%, 15 nm)/TPBi (65 nm)/LiF (1 nm)/$C_{60}$ (x angstroms)/Mg (100 nm), where the value of x was 1, 5, 10, 20, 30, and 50.

Without the fullerene adhesion promoting layer, magnesium either did not stick to the substrate during deposition, or was primarily deposited as a non-conductive oxide layer. Therefore, devices constructed without using a fullerene adhesion promoting layer were not functional and, as such, were not included in the plot of FIG. 16.

Furthermore, it can be seen that the thickness of the fullerene layer has little, if any effect on the current density at any given voltage. As such, fullerene deposition is robust and substantially coverage/thickness independent when fabricating an OLED comprising a magnesium cathode. This makes fullerene deposition and/or patterning using various techniques suitable for producing efficient OLED devices.

Figure 17:
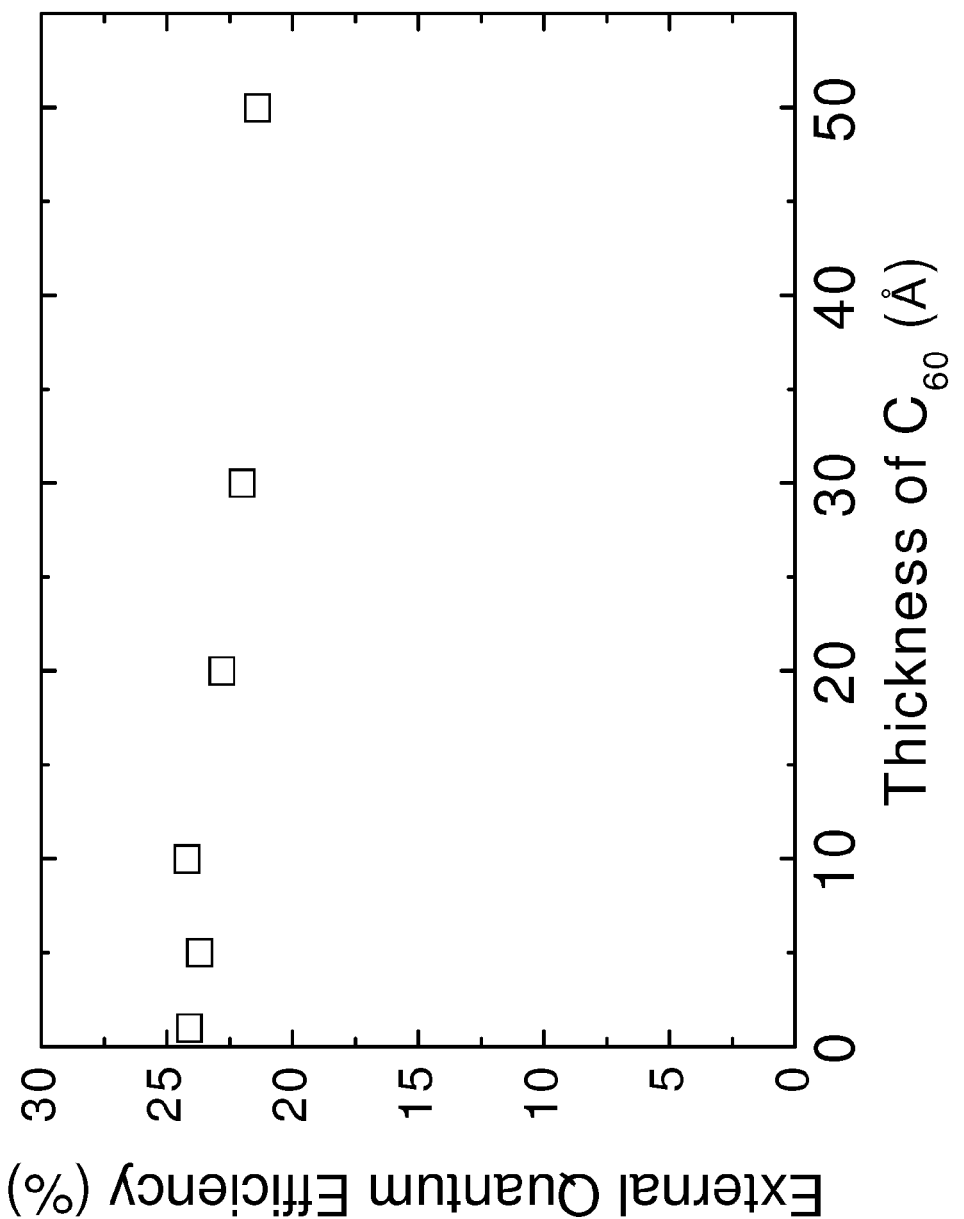
FIG. 17 is a chart showing the relationship between the EQE and fullerene adhesion promoting layer thickness for OLED devices comprising magnesium cathodes.

Similarly, FIG. 17 shows the EQE versus thickness of the fullerene layer for the above devices. The external quantum efficiency was measured at a luminance of 1,000 cd/m$^2$ using an OceanOptics USB4000 Fibre Optic Spectrometer with integrating sphere. Luminance was measured using a Minolta LS-110 Luminance Meter. From FIG. 17, it can be seen that the thickness of the fullerene adhesion promoting layer did not significantly affect the EQE below thicknesses of up to about 10 angstroms. At thicknesses greater than 10 angstroms, the EQE was observed as decreasing gradually with increasing thickness. It is hypothesized that the gradual decrease in efficiency with increasing fullerene layer thickness is due to the increasing absorbance of light by the fullerene. It is also noted that, as shown in FIG. 15, the absorbance of $C_{60}$ varies with wavelength. As such, this suggests that the rate of reduction in efficiency with increasing thickness of the fullerene layer depends on the emission wavelength of the OLED device.

Figure 18:
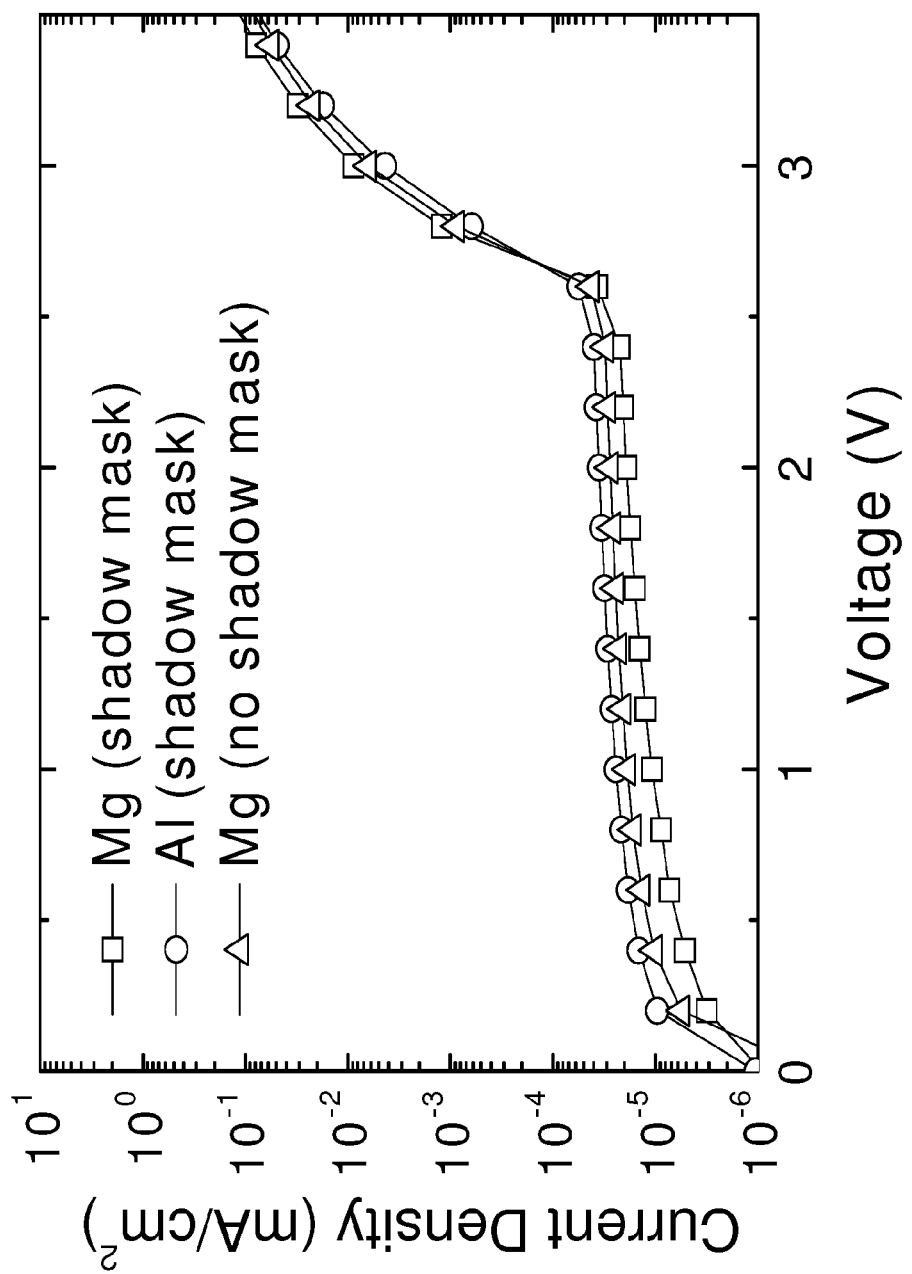
FIG. 18 is a chart showing the relationship between current density and voltage for OLED devices comprising one of: a magnesium cathode deposited using a shadow mask, an aluminum cathode deposited using a shadow mask, and a magnesium cathode deposited on a selectively treated surface.

FIG. 18 shows the current density as a function of voltage for green phosphorescent OLED devices comprising aluminum and magnesium cathodes. In the present example, the cathodes of the devices were patterned using various methods. The general device structures of the OLED devices tested in the present example are as follows: ITO/$MoO_3$ (1 nm)/CBP (50 nm)/CBP:Ir(ppy)$_2$(acac) (8%, 15 nm)/TPBi (65 nm)/LiF (1 nm)/Cathode (100 nm). A 1 angstrom-thick layer of fullerene comprising $C_{60}$ was deposited on the LiF layer for the magnesium cathode devices prior to the deposition of magnesium.

The aluminum cathode was patterned using a shadow mask process as previously described. Two devices having magnesium cathodes were created, each magnesium cathode being deposited using one of following two methods. The first method comprised depositing the fullerene adhesion promoting layer over the entire substrate and then depositing magnesium using a shadow mask process to selectively deposit a magnesium cathode on a portion of the treated surface. The second method comprised selectively treating a portion of the surface by depositing the fullerene adhesion promoting layer using a shadow mask process, then directing evaporated magnesium over the entire substrate. As explained above, the magnesium adhered only to treated areas of the substrate, thus forming a magnesium cathode.

From FIG. 18, it can be seen that all three devices exhibited similar current densities with respect to voltage. In particular, the magnesium cathode deposited on the patterned adhesion promoting layer exhibited similar performance to the device produced by depositing magnesium using a shadow mask process. Specifically, all three devices were found to exhibit a similar leakage current of below about 2.8V. This suggests that devices can be produced without conductive leakage paths between adjacent cathode lines of all devices, including those where magnesium was deposited on the patterned fullerene adhesion promoting layer. Therefore, efficient OLED devices may be fabricated using fullerene-patterned substrates for magnesium deposition.

TABLE 5

EQE of OLED Devices Comprising Mg and Al Patterned Cathodes

| Cathode Material | EQE (%) at 1,000 cd/m$^2$ |
| --- | --- |
| Mg (shadow mask) | 24.2 |
| Al (shadow mask) | 24.2 |
| Mg (no shadow mask) | 25.3 |

Referring to Table 5, a summary of device performances for the devices of FIG. 18 is provided. From the external quantum efficiency measurements, it can be seen that the device with a magnesium cathode deposited on the patterned fullerene adhesion promoting layer has a similar or possibly higher efficiency than the other devices. It is suggested that the efficiency of this device is higher due to contamination from the shadow mask used in depositing the material for the other two devices. Specifically, contaminants can desorb from the mask during the metal deposition processes, thereby contaminating the magnesium film and reducing the interface quality. Table 5 shows that an OLED device comprising a magnesium cathode deposited on a patterned fullerene adhesion promoting layer can be used in place of an aluminum cathode produced using traditional shadow mask deposition techniques.

Figure 19:
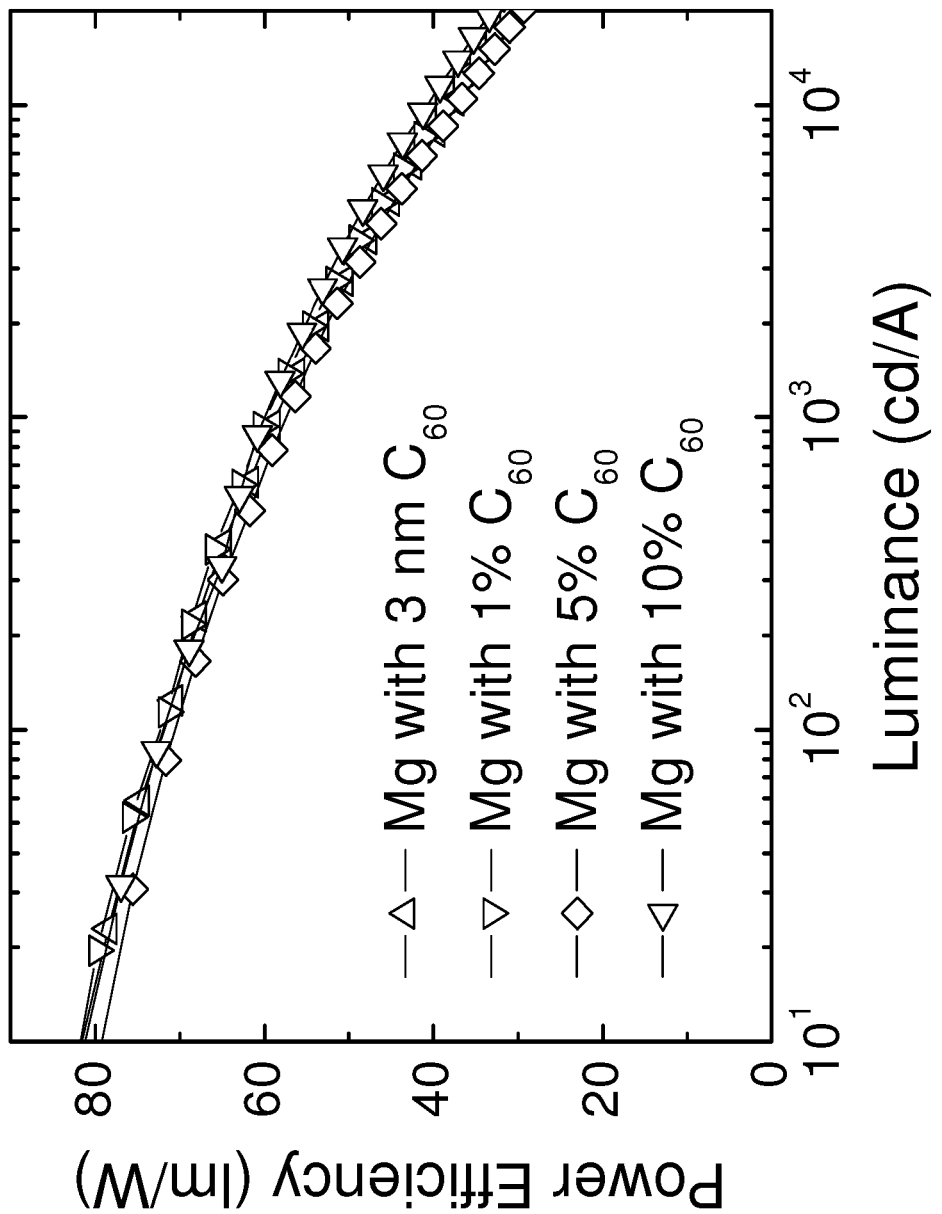
FIG. 19 is a chart showing the relationship between power efficiency and luminance for OLED devices comprising magnesium-fullerene cathodes with varying concentrations of fullerene present in the cathodes.

Another important device characteristic is the power efficiency. FIG. 19 shows the power efficiency, in lumens per watt (lm/W), as a function of luminance for green phosphorescent OLEDs comprising magnesium cathodes. The device structure is ITO/$MoO_3$ (1 nm)/CBP (35 nm)/CBP:Ir (ppy)$_2$(acac) (8%, 15 nm)/TPBi (65 nm)/LiF (1 nm)/magnesium (100 nm). The magnesium cathode was deposited according to one of two procedures. In one procedure, a 30 angstrom-thick fullerene adhesion promoting layer comprising $C_{60}$ was deposited on the LiF layer prior to deposition of magnesium. In the other procedure, the fullerene comprising $C_{60}$ was co-deposited along with magnesium. The fullerene and magnesium were deposited from separate sublimation sources at various concentrations by weight. For the co-deposited cathodes, the compositions were determined by weight using a quartz crystal microbalance.

It can be seen from FIG. 19 that devices with a magnesium cathode deposited over a 30 angstrom-thick fullerene adhesion promoting layer exhibited similar power efficiency at any given luminance to devices where the cathode was co-deposited. This demonstrates that the fullerene adhesion promoting layer can be formed by co-depositing magnesium with fullerene at concentration of as low as at least 1 and up to at least 10 percent by weight, thereby reducing the number of processing steps in a device fabrication process. Furthermore, because the OLED performance does not depend significantly on the concentration of fullerene in the magnesium cathode, the processing conditions do not require precise control over the deposition parameters to achieve desired cathode characteristics for many applications.

Figure 20:
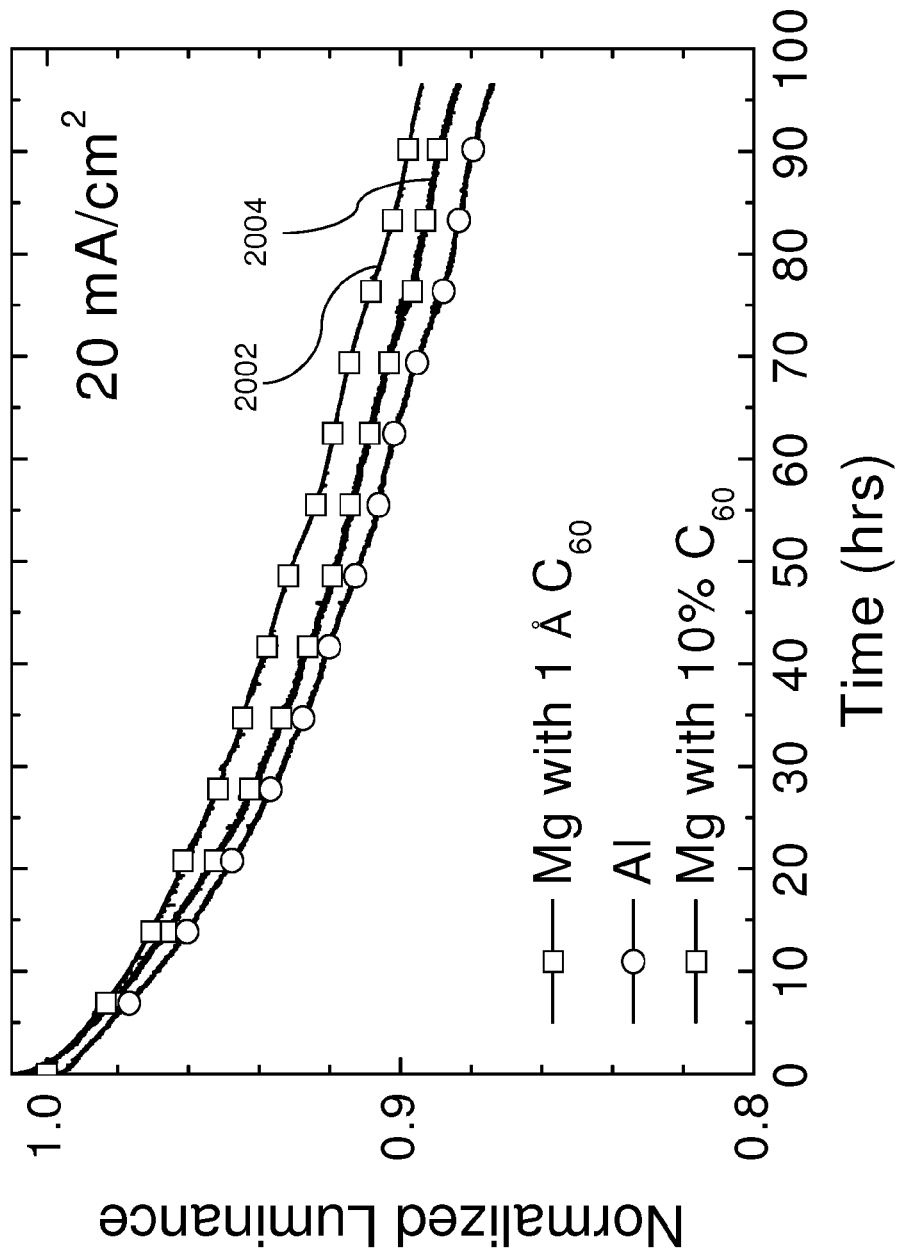
FIG. 20 is a chart showing the decay rate of luminance of OLED devices comprising various cathode structures.

Referring now to FIG. 20, a plot showing the normalized luminance of green phosphorescent OLED devices with respect to time is provided to illustrate the reduction in luminance as the device ages. The luminance was normalized to its initial value and the devices were driven at a current density of 20 mA/cm$^2$. The general device structure was ITO/MoO$_3$ (1 nm)/NBP (45 nm)/Alq$_3$ (60 nm)/LiF (1 nm)/Cathode (100 nm). The cathode of each device was one of the following: an aluminum cathode, a magnesium cathode deposited on a 1 angstrom fullerene adhesion promoting layer, and a magnesium cathode co-deposited with 10 percent by weight of fullerene. The fullerene used in the example devices comprised C$_{60}$. The devices were encapsulated with a glass cap using UV curable epoxy in a nitrogen filled glove box prior to testing.

From FIG. 20, it can be seen that the luminance of the devices with the magnesium cathodes were observed to decay at slower rates than the identical device with an aluminum cathode. This suggests that devices having magnesium cathodes are more stable than counterpart devices comprising aluminum cathodes. Further, the results suggest that devices comprising magnesium cathodes will generally retain their electroluminescent properties for a longer period of time compared to those comprising aluminum cathodes, thereby providing OLED devices with longer operating lifetimes.

Furthermore, it can be seen from FIG. 20 that the luminance of the OLED device comprising a co-deposited magnesium and fullerene electrode 2002 decays more slowly than the device comprising a magnesium electrode deposited on a fullerene adhesion promoting layer 2004. As such, devices with magnesium-fullerene cathodes 2002 may have longer operating lifetimes than those having pure magnesium cathodes 2004.

TABLE 6

Luminance Decay of OLED Devices Comprising Various Cathodes

| Cathode Material | Time (hrs) to 90% of Initial Luminance |
|---|---|
| Mg with 1 Å C$_{60}$ | 72.8 |
| Al | 63.4 |
| Mg with 10% C$_{60}$ | 88.4 |

Table 6 shows the time, in hours, until the OLED device of FIG. 20 is reduced to 90 percent of its original luminance, which is often referred to as T$_{90}$. From Table 6, it can be seen that the device with a magnesium cathode deposited on a 1 angstrom fullerene adhesion promoting layer was found to have a longer lifetime than the device having an aluminum cathode. Moreover, it was found that the device with a co-deposited magnesium-fullerene cathode 2002 has a longer lifetime than the other two devices tested. This suggests that devices comprising a magnesium cathode, and particularly those with a magnesium-fullerene cathode 2002, have longer operational lifetimes than equivalent devices having aluminum cathodes.

Figure 21:
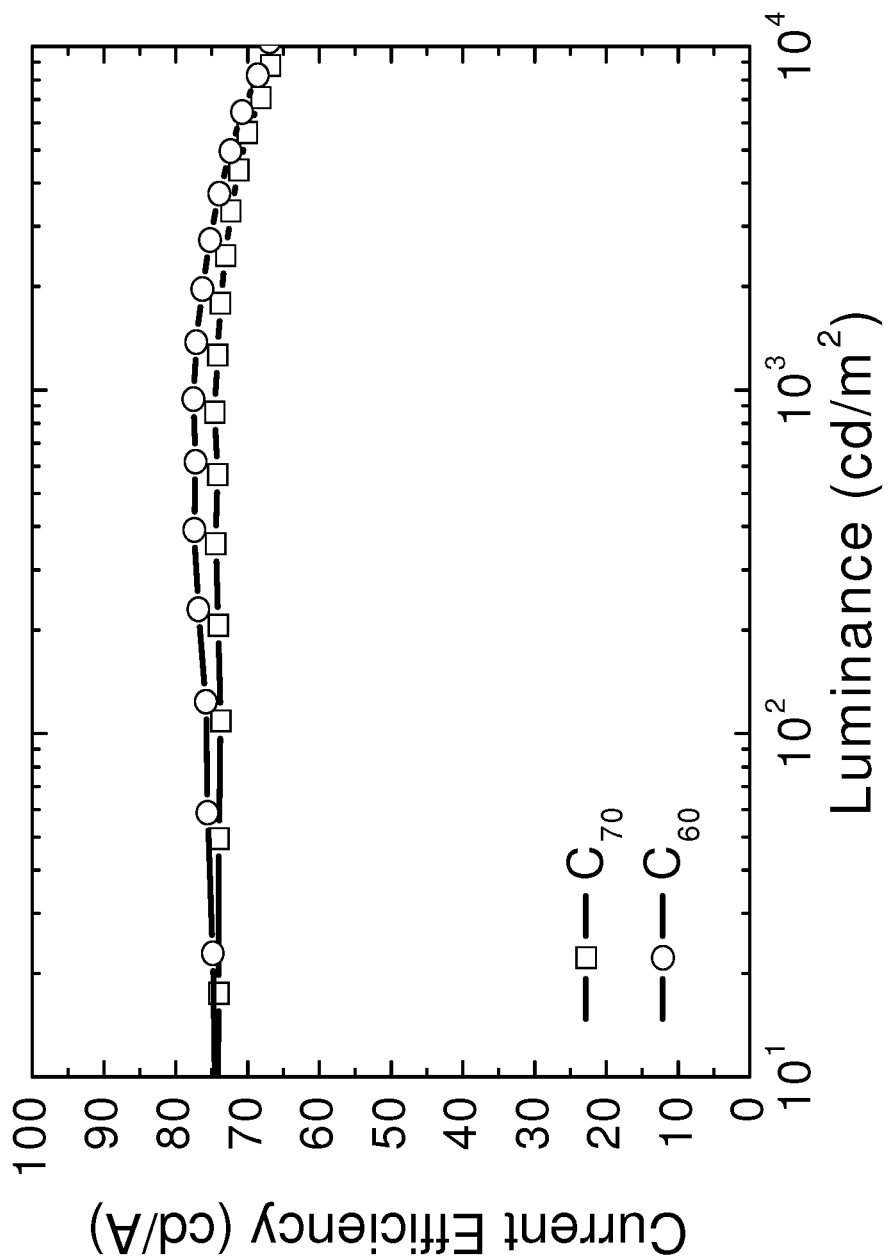
FIG. 21 is a chart showing the relationship between current efficiency and luminance for OLED devices comprising either a $C_{60}$ adhesion promoting layer or a $C_{70}$ adhesion promoting layer.

Referring now to FIG. 21, a plot of current efficiencies with respect to the luminance of OLED devices is provided. The devices were constructed by depositing the magnesium cathode on two different fullerene adhesion promoting layers. One adhesion promoting layer was principally comprised of C$_{60}$, whereas the other adhesion promoting layer was principally comprised of C$_{70}$. It will be appreciated that there may be, in addition to the principal components, other components present in the fullerene layer.

As can be seen from FIG. 21, the efficiency of the devices was found to be similar irrespective of which fullerene was used. This result suggests that fullerene other than C$_{60}$ and C$_{70}$ may be used to deposit magnesium instead of, or in addition to, C$_{60}$ and/or C$_{70}$. For example, a mixture of 50% by weight C$_{60}$ and 50% by weight C$_{70}$ may be used. Other types of fullerene which may be used include other polyhedral fullerenes such as spherical fullerenes, tubular fullerenes such as CNTs, fullerene rings, etc. However, it will be appreciated that the thickness of the optimum fullerene layer or the optimum concentration of the fullerene within the magnesium may differ depending on the type of fullerene used. As the inventors postulate that the fullerene acts as nucleation sites for the deposition of magnesium, larger fullerenes may provide larger initiation sites. Similarly, longer fullerenes may provide elongated initiation sites. As such, the concentration and proportion of fullerenes used to treat the surface for deposition of magnesium on a substrate may be selected based on the factors such as the morphology and size of the fullerene.

UV photoelectron spectroscopy experiments were conducted to further investigate the interactions between magnesium and fullerene. A plot showing the ultraviolet (UV) photoelectron intensity as a function of binding energy for three thin film samples is provided in FIG. 22. One sample comprised only C$_{60}$. The other two samples are C$_{60}$ co-deposited with magnesium (Mg:C$_{60}$), and magnesium deposited on a C$_{60}$ adhesion promoting layer (C$_{60}$/Mg). The samples were analyzed using ultraviolet photoelectron spectrometer with He lα (hv=21.22 eV) in a PHI 5500 Multi-Technique System at a base pressure of ~10$^{-10}$ Torr.

Figure 22:
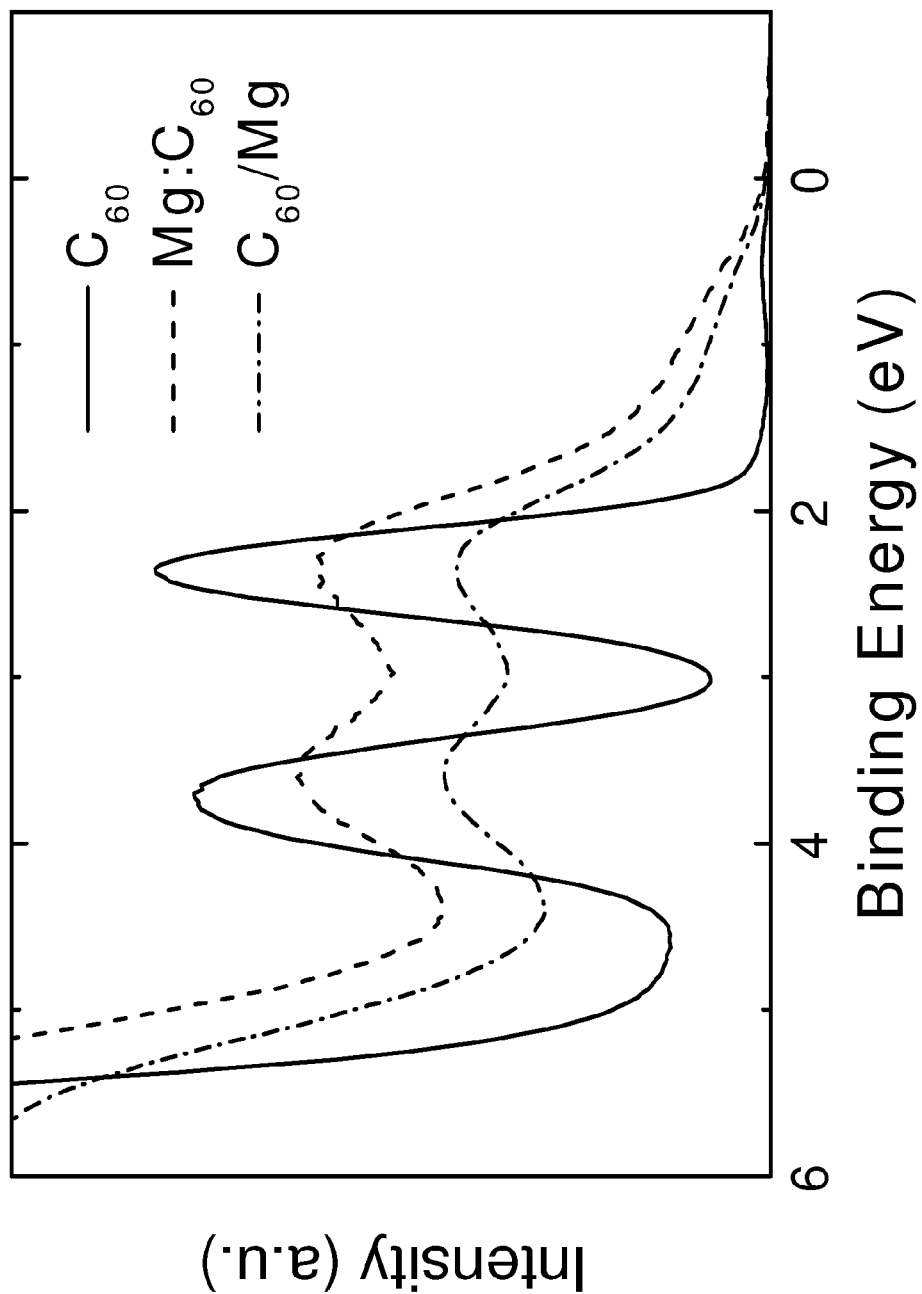
FIG. 22 is a chart showing the photoelectron intensity as a function of binding energy for a fullerene film, a magnesium film deposited on a fullerene adhesion promoting layer and a magnesium film intermixed with fullerene.

The scale of FIG. 22 is referenced with respect to the Fermi level (i.e. at zero eV binding energy) of a sputter cleaned Au substrate in electrical contact with the sample. The highest occupied molecular orbital (HOMO) peak appears in all of the spectra at a binding energy of about 2.5 eV. The HOMO-1 derived peak also appears in all of the spectra at a binding energy of between 3.6 and 3.7 eV. The small feature in the C$_{60}$ spectrum at approximately 0.5 eV is an artifact from the He 1β (hv=23.09 eV) satellite line exciting the HOMO of C$_{60}$.

From FIG. 22, it can be seen that the full width at half maximum (FWHM) of the HOMO and HOMO-1 derived peaks increases as the HOMO-1 peak is shifted to lower binding energy. This indicates that the energy of the chemical bonds between the carbon atoms in the fullerene is reduced and is suggestive of a new bonding structure. Furthermore, a new feature appears in the spectra between the HOMO derived peak and the Fermi level for the C$_{60}$ co-deposited with magnesium, and magnesium deposited on C$_{60}$ thin films. The shift in the Fermi level is also indicative that a new bonding structure has been formed and that the decrease in band gap suggests that this change in bonding structure is associated with an increase in conductivity.

These characteristic features are consistent with photoelectron spectra of magnesium fulleride, as is presented in Physical Review B 45, 8845 (1992). As such, this suggests that a charge transfer takes place between the magnesium and the fullerene. These features also suggest that magnesium fulleride is formed for both $C_{60}$ co-deposited with magnesium, and magnesium deposited on $C_{60}$ thin films. As such, for devices having a magnesium cathode deposited on a fullerene adhesive promoting layer, magnesium fulleride may be formed at the interface of the magnesium cathode and the ETL.

TABLE 7

Performance of Devices with Varying Cathode Structures

| Cathode Structure | Driving Voltage (V) at 20 mA/cm² | Luminance (cd/m²) at 500 mA/cm² | Power Efficiency (lm/W) at 20 mA/cm² |
| --- | --- | --- | --- |
| Al | 8.3 | 3,530 | 0.63 |
| LiF/Al | 5.9 | 19,900 | 2.2 |
| $C_{60}$/Al | 8.3 | — | — |
| $C_{60}$/LiF/Al | 5.8 | 19,700 | 2.3 |
| LiF/$C_{60}$/Al | 5.8 | 19,800 | 2.3 |
| Mg | 11 | 30 | 0.02 |
| LiF/Mg | — | — | — |
| $C_{60}$/Mg | 8.1 | 9,810 | 0.86 |
| $C_{60}$/LiF/Mg | 6.0 | 21,200 | 2.4 |
| LiF/$C_{60}$/Mg | 6.0 | 21,100 | 2.4 |

Table 7 provides a summary of device performance for green fluorescent devices having various cathode structures. The basic device structure of the devices tested is as follows: ITO/CuPC (25 nm)/NBP (45 nm)/Alq$_3$ (60 nm)/Cathode Structure. For each of the various cathode structures, the thickness of the LiF layer was approximately 1 nm, the thickness of the fullerene layer comprising $C_{60}$ was approximately 3 nm, and the thicknesses of the Al and Mg layers were about 100 nm. Luminance was measured using a Minolta LS-110 Luminance Meter.

From Table 7, it can be seen that the use of a fullerene adhesion promoting layer comprising $C_{60}$ between the LiF layer and Al cathode, or between the Alq$_3$ layer and the LiF layer does not significantly alter the driving voltage, luminance or power efficiency of devices comprising an aluminum cathode. It is also noted that the device with a $C_{60}$/Al cathode structure did not emit any detectable light up to a current density of about 500 mA/cm². It is noted that the devices with either a LiF/Mg cathode or a pure magnesium cathode having no fullerene adhesion promoting layer did not function or showed poor performance since the entire magnesium cathode of this device was oxidized.

It can also be seen from Table 7 that the device performance of $C_{60}$/LiF/Mg is similar to the device performance of LiF/$C_{60}$/Mg cathode structures. Furthermore, these cathode structures are similar in performance to comparable devices with aluminum cathodes. This suggests that for sufficiently thin electron injection layers comprising small molecules (e.g., 1 nm thick LiF), the fullerene adhesion promoting layer may be deposited before or after the electron injection layer.

The effects of the choice of the EIL material and the order of deposition on the device performance were further studied by measuring the performances of two example green fluorescent OLED devices. In particular, both devices were constructed using 8-Hydroxyquinolinolatolithium (Liq) as the EIL. For the first device, the cathode structure was constructed by depositing fullerene on the EIL and then depositing the magnesium cathode on the fullerene treated surface. However, for the second device, the cathode structure was constructed by depositing fullerene on the organic layer, followed by depositing the EIL and the magnesium cathode on top of the EIL to effectively produce a cathode structure where the fullerene and the magnesium cathode are separated by the Liq EIL.

Specifically, the OLED devices were each constructed according to the following procedure. A transparent conducting anode of ITO was coated on a glass substrate and ultrasonically cleaned with a standard regiment of Alconox™ dissolved in deionized (DI) water, acetone, and methanol. The ITO substrate was then subjected to a UV ozone treatment for 15 minutes in a Photo Surface Processing Chamber (Sen Lights). A 1 nm-thick high work function MoO$_3$ layer was then deposited on the ITO anode. A 25 nm-thick layer of 1,4,5,8,9,11-hexaazatriphenylene hexacarbonitrile (HATCN) hole transporting layer (HTL) was then deposited on the ITO layer as a hole injection layer. A 45 nm-thick a-NPD hole transport layer was then deposited on the HATCN layer. A 60 nm-thick Alq3 green emitting layer was deposited on the HTL then the cathode constructions described above were deposited on the emitting layer to produce the respective devices.

The first cathode construction comprised a 1 nm layer of Liq deposited on the emitting layer, followed by a 3 nm $C_{60}$ fullerene layer, and finally, a 500 nm thick magnesium cathode. The second cathode construction, on the other hand, comprised a 3 nm $C_{60}$ fullerene layer deposited on the emitting layer followed by a 1 nm thick Liq EIL and a 500 nm thick magnesium cathode. The measurements taken from the two devices are summarized in Table 8 below.

TABLE 8

Effect of Cathode Structure on Device Efficiency

| Cathode Structure | Driving Voltage (V) at 20 mA/cm² | Luminance (cd/m²) at 500 mA/cm² | Power Efficiency (lm/W) at 20 mA/cm² |
| --- | --- | --- | --- |
| Liq/$C_{60}$/Mg | 4.9 | 18990 | 2.41 |
| $C_{60}$/Liq/Mg | 7.1 | — | 0.63 |

As is shown in Table 8, unlike in the cases where LiF was used as the EIL, the order of the material deposition significantly affects the performance of the device when Liq is used as the EIL. The inventors postulate that this is likely due to the inability of Liq to penetrate the fullerene layer as effectively as LiF, as Liq molecules are significantly larger than LiF molecules.

Referring to Table 8, it can be seen that the order of deposition of the EIL with respect to the fullerene has significant impact on the device performance. For example, the device with a fullerene layer disposed adjacent to the magnesium cathode exhibited a driving voltage of about 4.9 V at 20 mA/cm², whereas an identical device with the Liq layer disposed between fullerene and the magnesium cathode required 7.1 V to be driven at 20 mA/cm². Similarly, the luminance of the first device was measured to be 18990 cd/m² at 500 mA/cm², whereas the second device did not emit any detectable light when driven at 500 mA/cm². Moreover, it is noted that the power efficiency of the first device is substantially higher than the power efficiency of the second device.

To compare the shelf-life of a device comprising a magnesium cathode to an identical device comprising an aluminum cathode, example OLED devices comprising two different cathode materials were constructed and stored at ambient conditions. More specifically, the devices were not encapsulated in any packaging in the present example for purposes of studying the effects caused by exposure of the devices to air.

The two example green fluorescent OLED devices were each constructed according to the following procedure. A transparent conducting anode of ITO was coated on a glass substrate and ultrasonically cleaned with a standard regiment of Alconox™ dissolved in deionized (DI) water, acetone, and methanol. The ITO substrate was then subjected to a UV ozone treatment for 15 minutes in a Photo Surface Processing Chamber (Sen Lights). A 1 nm-thick high work function $MoO_3$ layer was then deposited on the ITO anode. A 45 nm-thick a-NPD hole transporting layer (HTL) was then deposited on the $MoO_3$ layer 1012. A 60 nm-thick green emissive layer of Alq3 was deposited on the a-NPD HTL. A 1 nm-thick LiF layer was then deposited on the Alq3 layer. The first device was then constructed by depositing a 100 nm-thick Al cathode on the LiF layer, whereas the second device was constructed by depositing a $C_{60}$ adhesion promoting layer (~3 nm) on the LiF layer, followed by deposition of the magnesium cathode having a thickness greater than about 3 microns.

It is noted that the deposition of the magnesium cathode was conducted at a rate of up to about 30 nm/s. Such a rate is difficult to attain when using aluminum deposition techniques to deposit aluminum on organic surfaces due to the complicated, expensive equipment required. Furthermore, damage to the substrate may be imparted by the deposited aluminum due, at least in part, to the large thermal buildup at the surface of the organic layer. Such a buildup of heat may affect the organic layer and, ultimately, lead to devices that exhibit poor performance or those which are not functional. As such, typical aluminum deposition techniques known in the art deposit in the range of few atomic layers per second to few nanometers per second. Furthermore, particularly in cases where a relatively thick coating of magnesium is deposited to act both as a cathode and a getterer, with or without fullerene dispersed therein, fabrication of such devices may be completed in fewer steps in comparison to similar devices comprising aluminum cathodes.

It is well known that dark spots generally form in OLED devices over time due to degradation of the emissive material. It is also known that the rate of degradation of a device is generally accelerated when the device is exposed to oxygen and/or water vapour. As such, the rate of formation of dark spots in OLED devices is generally correlated with the shelf-life of such devices. It is noted that, to show accelerated shelf-life data, the example devices were not packaged, and as such, the rate at which oxygen, water vapour, and other species that reduce the shelf-life of OLED devices can penetrate the device was higher than if the devices were packaged. As such, it is expected that the examples presented herein would exhibit substantially longer effective shelf-life if they are packaged and substantially sealed from ambient conditions.

Figure 23A:
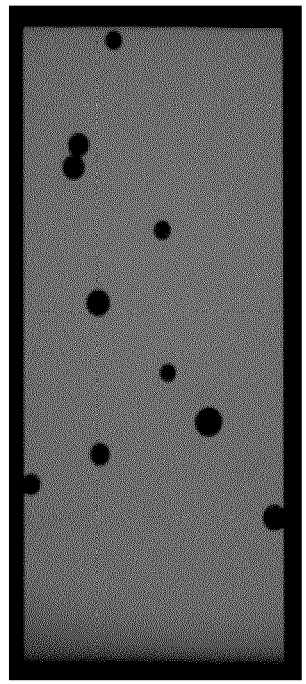
FIG. 23A is an optical micrograph of an example OLED device comprising an aluminum cathode shortly after manufacture.
Figure 23B:
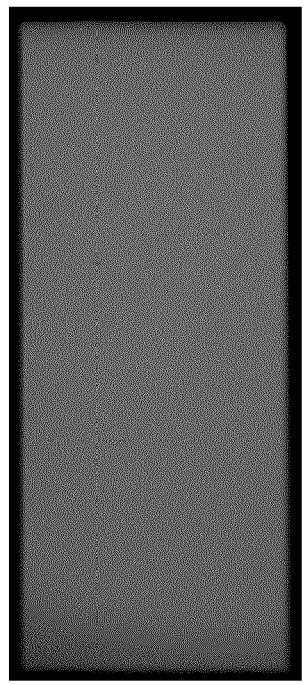
FIG. 23B is an optical micrograph of the example OLED device of FIG. 23A comprising the aluminum cathode taken after the device has been exposed to ambient conditions for 208 hours.

Turning to FIG. 23A, a micrograph of the example device comprising an aluminum cathode is shown immediately after fabrication. As is clear from the micrograph, although there are few visible dark spots, none are of substantial diameter. FIG. 23B shows the same example device after being subjected to ambient conditions for 208 hours. As is clearly shown in FIG. 23B, there are numerous dark spots of substantial diameter. For reference, the dimensions of each of FIGS. 23A and 23B are 2 mm in height by 4.5 mm in width.

Figure 24A:
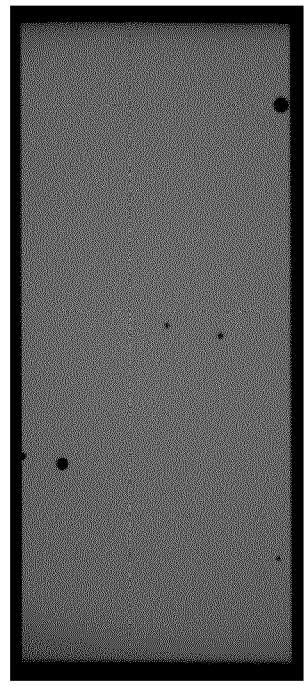
FIG. 24A is an optical micrograph of an example OLED device comprising a magnesium cathode deposited over a fullerene adhesion promoting layer shortly after manufacture.
Figure 24B:
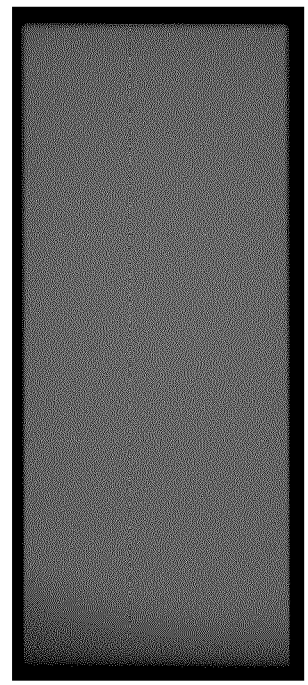
FIG. 24B is an optical micrograph of the example OLED device of FIG. 24A comprising the magnesium cathode taken after the device has been exposed to ambient conditions for 208 hours.

Referring to FIG. 24A, a micrograph of the example device comprising a magnesium cathode is shown immediately after fabrication. As is clear from the micrograph, there are very little, if any, visible dark spots. FIG. 24B shows the same example device after being subjected to ambient conditions for 208 hours. As is shown in FIG. 24B, there are only few dark visible dark spots and the diameters of these dark spots are substantially smaller compared to those formed in the device comprising the aluminum cathode. The dimensions of each of FIGS. 24A and 24B are also 2 mm in height by 4.5 mm in width.

Figure 25:
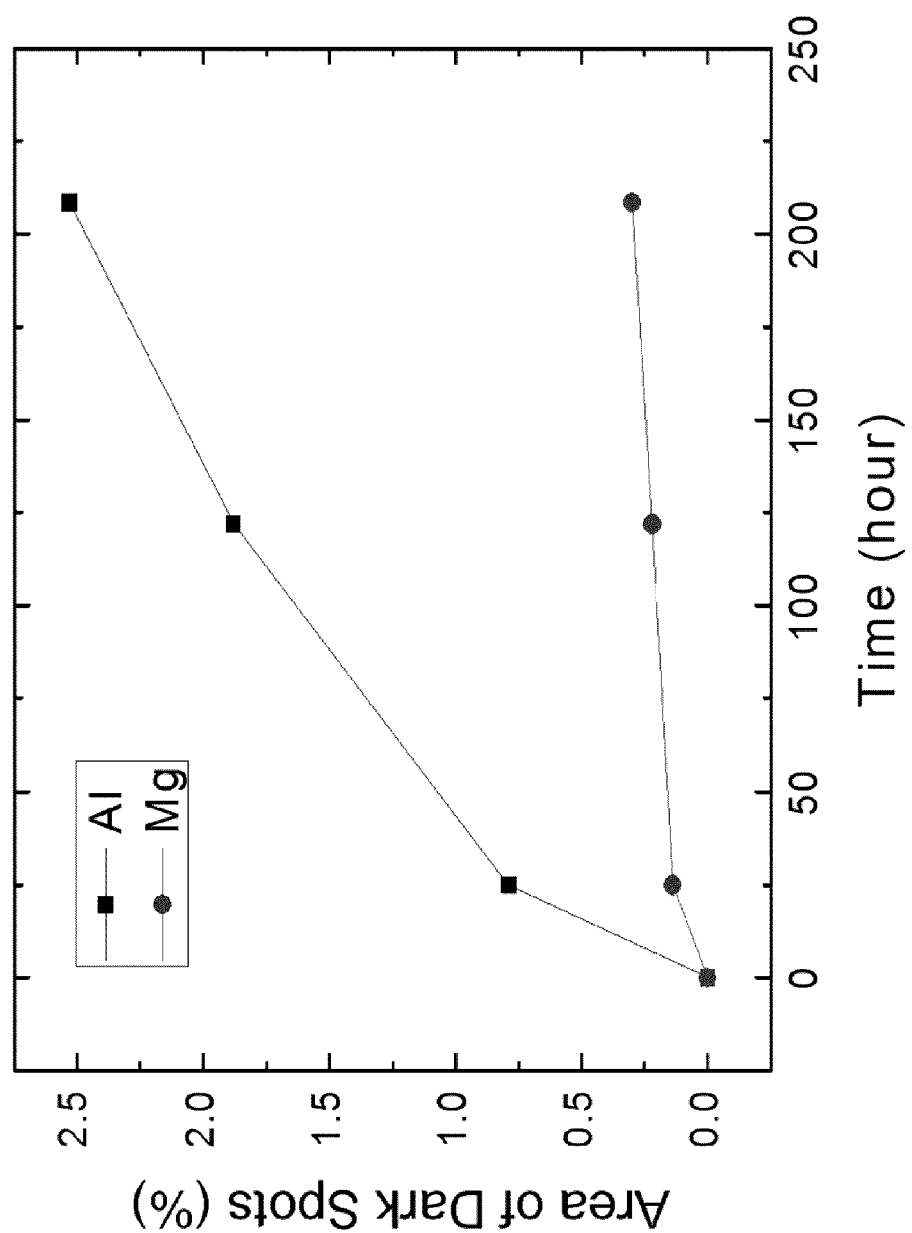
FIG. 25 is a chart showing the fraction of an OLED device that developed into dark spots over time for the example OLED devices of FIGS. 23A and 24A.

Turning to FIG. 25, a chart plotting the total area of dark spots as a percentage of the emitting area for the above devices is provided. As shown in FIG. 25, the device comprising the magnesium cathode was observed as degrading at a substantially slower rate than the identical device comprising the aluminum cathode. As such, similar OLED devices comprising magnesium cathodes, especially if encapsulated properly, are expected to offer substantially longer shelf-life compared to identical devices comprising conventional aluminum cathodes.

Although the invention has been described with reference to certain specific embodiments, various modifications thereof will be apparent to those skilled in the art. Any examples provided herein are included solely for the purpose of illustrating the invention and are not intended to limit the invention in any way. Any drawings provided herein are solely for the purpose of illustrating various aspects of the invention and are not intended to be drawn to scale or to limit the invention in any way. The scope of the claims appended hereto should not be limited by the preferred embodiments set forth in the above description, but should be given the broadest interpretation consistent with the present specification as a whole. The disclosures of all prior art recited herein are incorporated herein by reference in their entirety.

The invention claimed is:

1. A light emitting optoelectronic device comprising:
   a first electrode and a second electrode, the second electrode comprising magnesium and fullerene;
   a semiconductor layer interposed between the first electrode and the second electrode, the semiconductor layer comprising an electroluminescent layer; and
   fullerene disposed at the interface between the semiconductor layer and the second electrode;
   wherein the fullerene is dispersed within the magnesium.

2. The light emitting optoelectronic device according to claim 1, wherein the optoelectronic device is an organic light-emitting diode.

3. The light emitting optoelectronic device according to claim 1, wherein the second electrode comprises up to about 10% fullerene by weight.

4. The light emitting optoelectronic device according to claim 3, wherein the second electrode comprises up to about 5% fullerene by weight.

5. The light emitting optoelectronic device according to claim 1, wherein the second electrode comprises substantially pure magnesium.

6. The light emitting optoelectronic device according to claim 1, wherein the fullerene comprises at least one of $C_{60}$, $C_{70}$, $C_{76}$, $C_{84}$, single-wall carbon nanotubes, and multi-wall carbon nanotubes.

7. The light emitting optoelectronic device according to claim 1, wherein the thickness of fullerene is less than about 10 angstroms.

8. The light emitting optoelectronic device according to claim 1, wherein the second electrode is reflective.

9. The light emitting optoelectronic device according to claim 1 further comprising a substrate.

10. The light emitting optoelectronic device according to claim 9, wherein the first electrode is disposed on the substrate.

11. The light emitting optoelectronic device according to claim 1, wherein the semiconductor layer further comprises at least one of electron injection layer, electron transport layer, hole transport layer, and hole injection layer.

12. The light emitting optoelectronic device according to claim 1, wherein the first electrode is an anode and the second electrode is a cathode.

13. A light emitting optoelectronic device comprising
a first electrode and a second electrode, the second electrode comprising magnesium and fullerene, wherein the fullerene is dispersed within the magnesium;
a semiconductor layer interposed between the first electrode and the second electrode, the semiconductor layer comprising an electroluminescent layer;
fullerene disposed at the interface between the semiconductor layer and the second electrode and a getterer, the getterer comprising magnesium.

14. The light emitting optoelectronic device according to claim 13, wherein the getterer is formed integral with the second electrode.

15. The light emitting optoelectronic device according to claim 13, wherein the optoelectronic device is an organic light-emitting diode.

16. The light emitting optoelectronic device according to claim 13, wherein the second electrode comprises up to about 10% fullerene by weight.

17. The light emitting optoelectronic device according to claim 16, wherein the second electrode comprises up to about 5% fullerene by weight.

18. The light emitting optoelectronic device according to claim 13, wherein the fullerene comprises at least one of $C_{60}$, $C_{70}$, $C_{76}$, $C_{84}$, single-wall carbon nanotubes, and multi-wall carbon nanotubes.

19. The light emitting optoelectronic device according to claim 13, wherein the thickness of fullerene is less than about 10 angstroms.

20. The light emitting optoelectronic device according to claim 13, wherein the second electrode is reflective.

21. The light emitting optoelectronic device according to claim 13 further comprising a substrate.

22. The light emitting optoelectronic device according to claim 21, wherein the first electrode is disposed on the substrate.

23. The light emitting optoelectronic device according to claim 13, wherein the semiconductor layer further comprises at least one of electron injection layer, electron transport layer, hole transport layer, and hole injection layer.

24. The light emitting optoelectronic device according to claim 13, wherein the first electrode is an anode and the second electrode is a cathode.

* * * * *